United States Patent
Itou et al.

(10) Patent No.: US 10,074,670 B2
(45) Date of Patent: Sep. 11, 2018

(54) COLOR FILTER SUBSTRATE AND DISPLAY DEVICE

(71) Applicant: Japan Display Inc., Minato-ku (JP)

(72) Inventors: Osamu Itou, Tokyo (JP); Kenji Nakao, Tokyo (JP); Toshimasa Ishigaki, Tokyo (JP); Daisuke Sonoda, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 14/953,992

(22) Filed: Nov. 30, 2015

(65) Prior Publication Data
US 2016/0154273 A1 Jun. 2, 2016

(30) Foreign Application Priority Data
Dec. 1, 2014 (JP) .................. 2014-242798

(51) Int. Cl.
| | |
|---|---|
| *G02F 1/1335* | (2006.01) |
| *H01L 27/12* | (2006.01) |
| *G02B 5/20* | (2006.01) |
| *G02F 1/1362* | (2006.01) |

(52) U.S. Cl.
CPC ............ *H01L 27/124* (2013.01); *G02B 5/201* (2013.01); *G02F 1/133514* (2013.01); *G02F 1/136286* (2013.01); *G02F 2001/136222* (2013.01); *G02F 2201/52* (2013.01)

(58) Field of Classification Search
CPC ............... G02F 1/1343; G02F 1/13394; G02F 1/133514; G02F 1/136286; G02F 2001/136222; G09G 3/3607

USPC ....... 349/106, 155, 156, 108, 109, 110, 139, 349/143
See application file for complete search history.

(56) References Cited

U.S. PATENT DOCUMENTS

| | | | |
|---|---|---|---|
| 6,031,512 A | 2/2000 | Kadota et al. | |
| 7,538,850 B2 * | 5/2009 | Kim ................... | G02F 1/13394 349/106 |

(Continued)

FOREIGN PATENT DOCUMENTS

| | | |
|---|---|---|
| CN | 1530721 A | 9/2004 |
| CN | 101008750 A | 8/2007 |

(Continued)

OTHER PUBLICATIONS

Office Action dated Jul. 18, 2017, in Chinese Patent Application No. 201510863349.2 (with English-language translation).

*Primary Examiner* — Audrey Y Chang
(74) *Attorney, Agent, or Firm* — Oblon, McClelland, Maier & Neustadt, L.L.P.

(57) ABSTRACT

In an embodiment, a color filter substrate includes an substrate, first to fifth lines, first to third switching elements, first to third electrodes, color filter layer between electrodes and the substrate, and insulating layer with first to third apertures. The first electrode is formed in a first area defined by lines at the first line side, and the second electrode is formed in the first area at the second line side. The third electrode is formed in a second area defined by lines. Electrodes are connected to switching elements through apertures respectively. The first aperture is formed at the first line side, and the second aperture is formed at the second line side.

20 Claims, 23 Drawing Sheets

(56) References Cited

U.S. PATENT DOCUMENTS

| | | | | |
|---|---|---|---|---|
| 7,719,652 | B2* | 5/2010 | Son | G02F 1/134363 |
| | | | | 349/141 |
| 7,916,244 | B2* | 3/2011 | Hur | G02F 1/133707 |
| | | | | 349/106 |
| 8,866,715 | B2* | 10/2014 | Tsubata | G09G 3/3614 |
| | | | | 345/204 |
| 8,891,044 | B2* | 11/2014 | Hirota | G09G 3/3607 |
| | | | | 349/106 |
| 2012/0133855 | A1* | 5/2012 | Whangbo | G02F 1/1343 |
| | | | | 349/41 |

FOREIGN PATENT DOCUMENTS

| | | |
|---|---|---|
| CN | 101162320 A | 4/2008 |
| JP | 11-24061 | 1/1999 |

\* cited by examiner

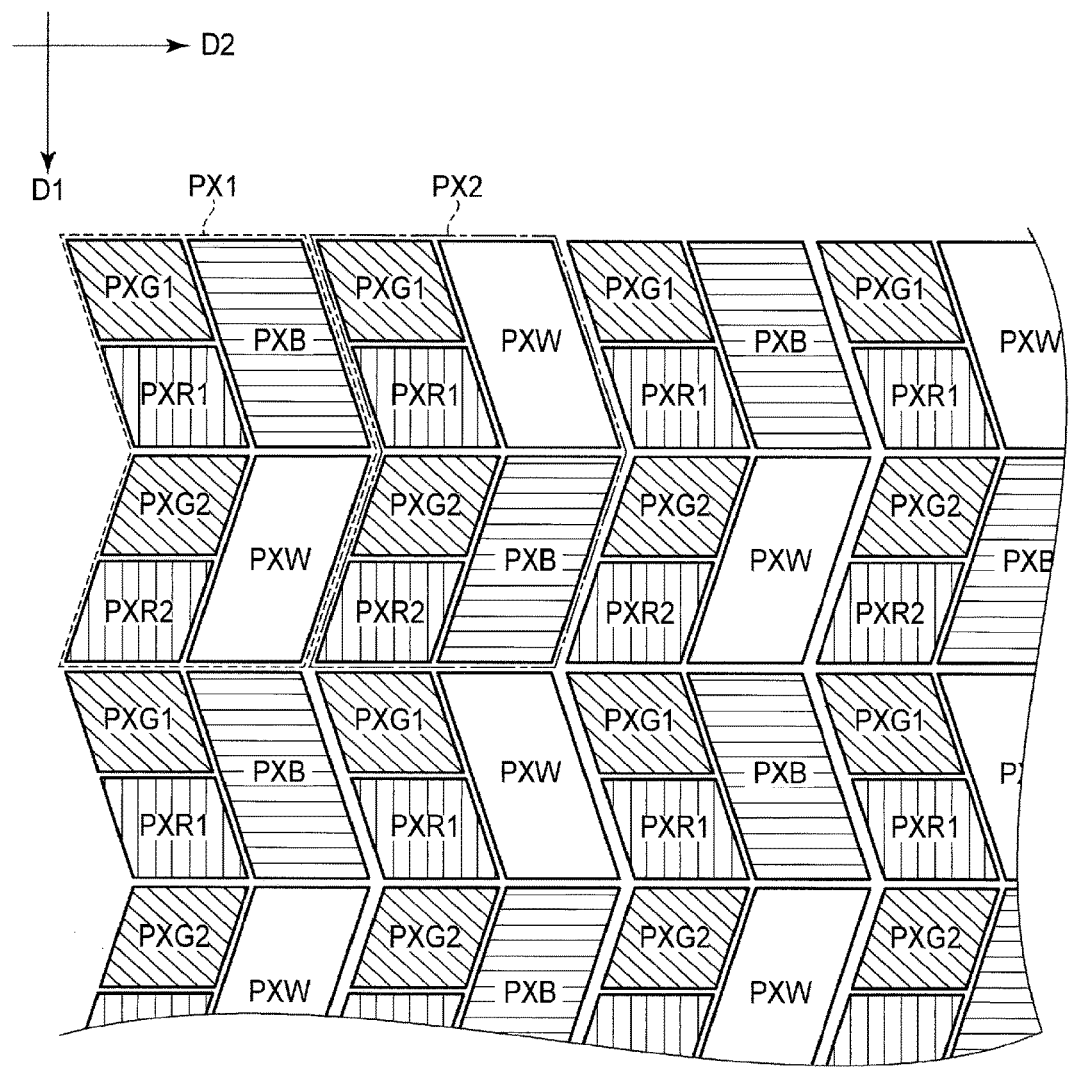
F I G. 3

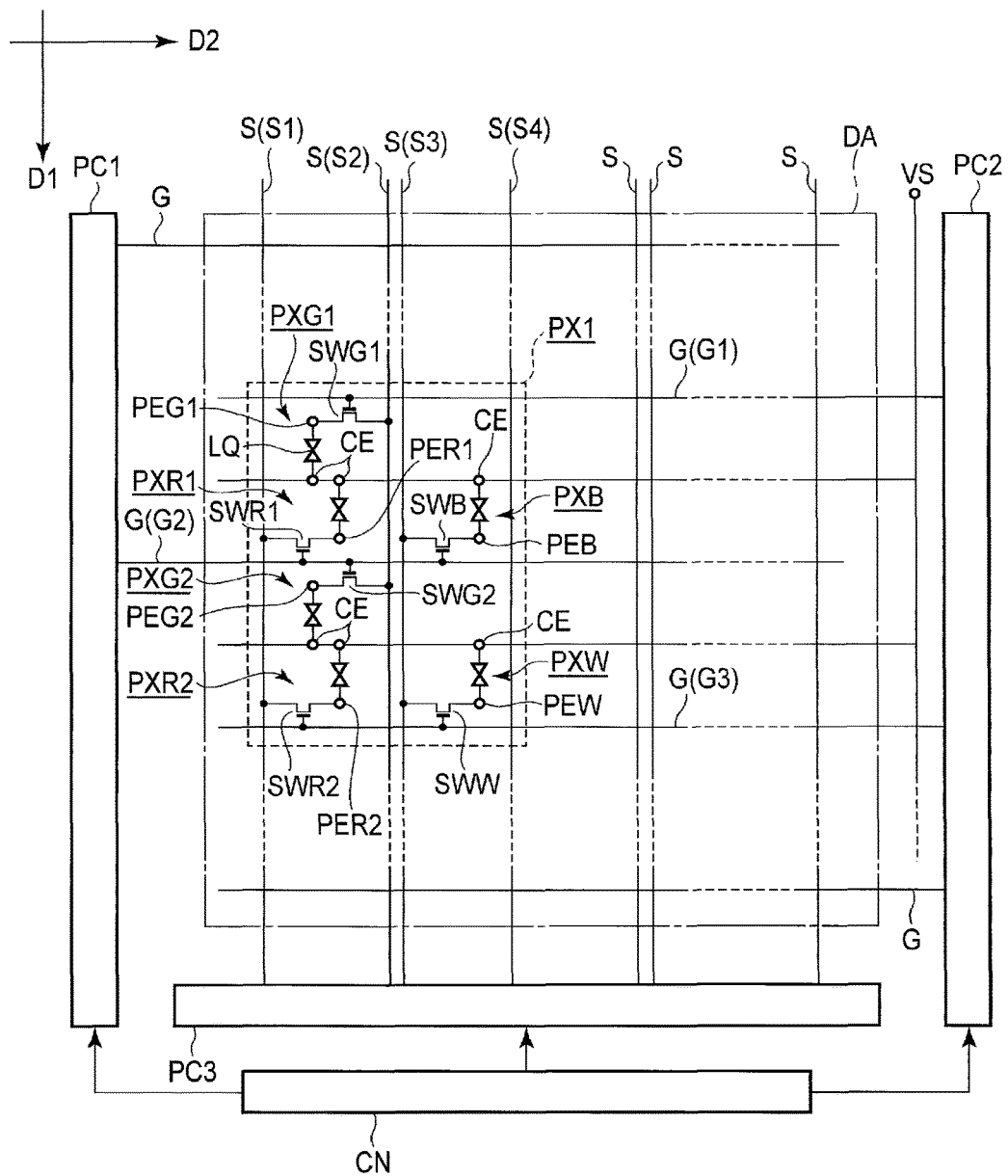
F I G. 4

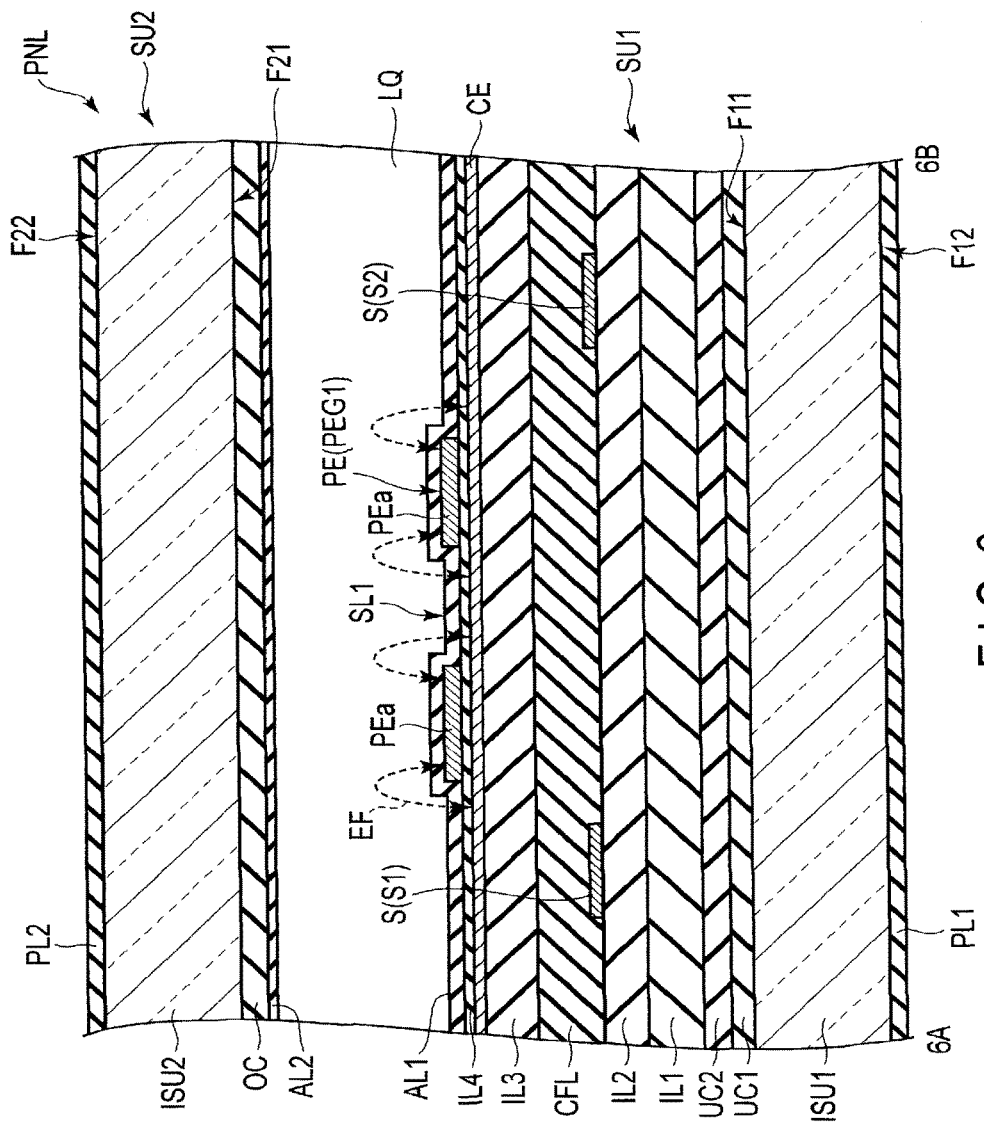
F I G. 6

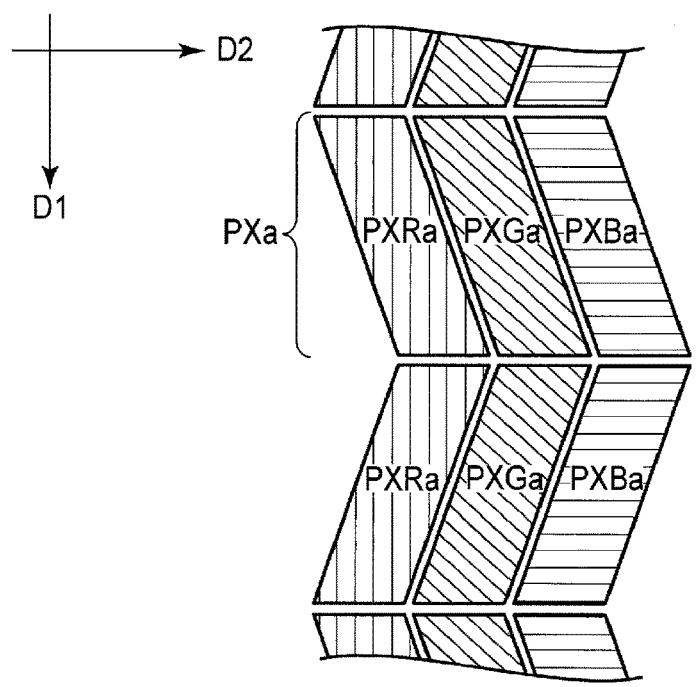
F I G. 11
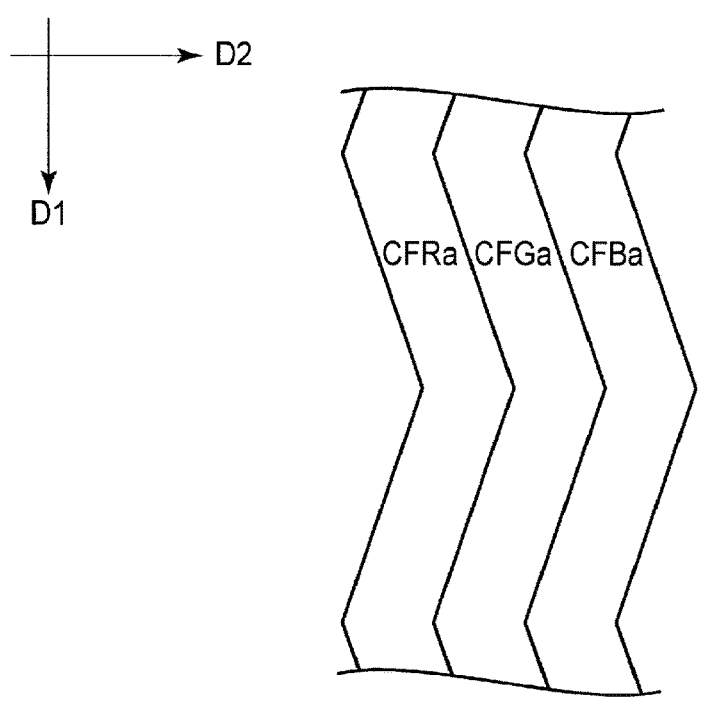
F I G. 12

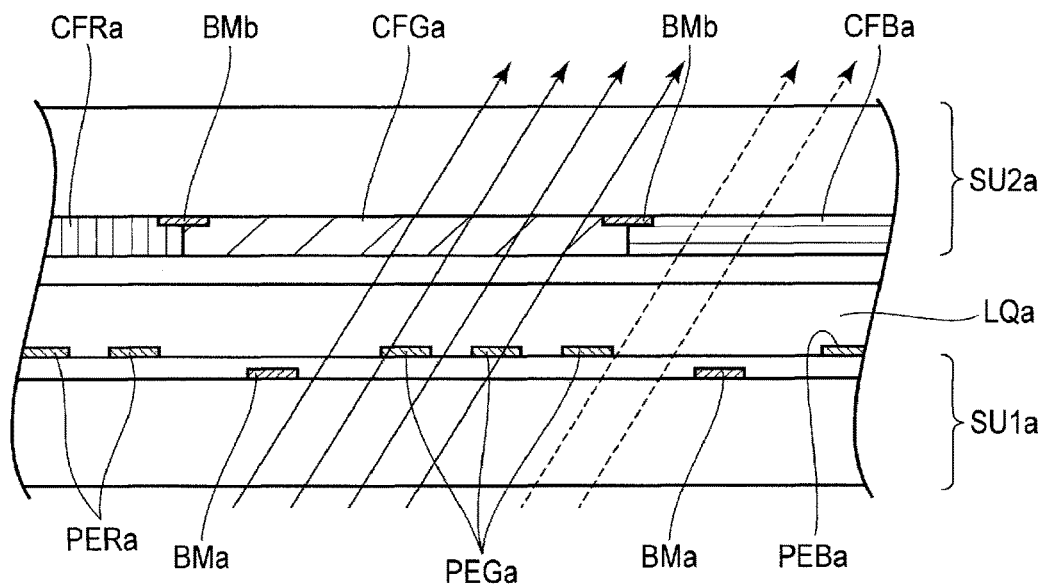
F I G. 14
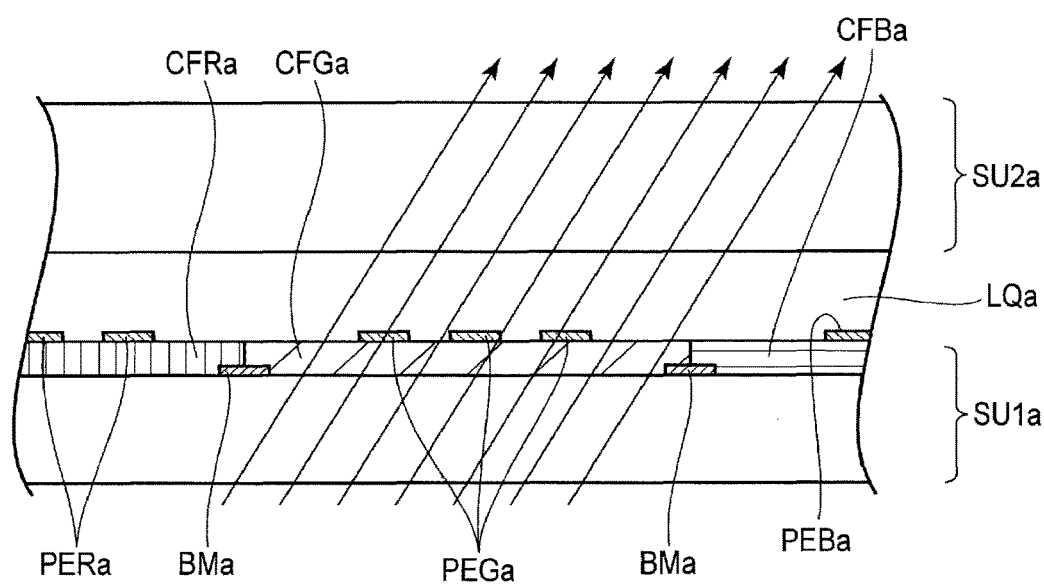
F I G. 15

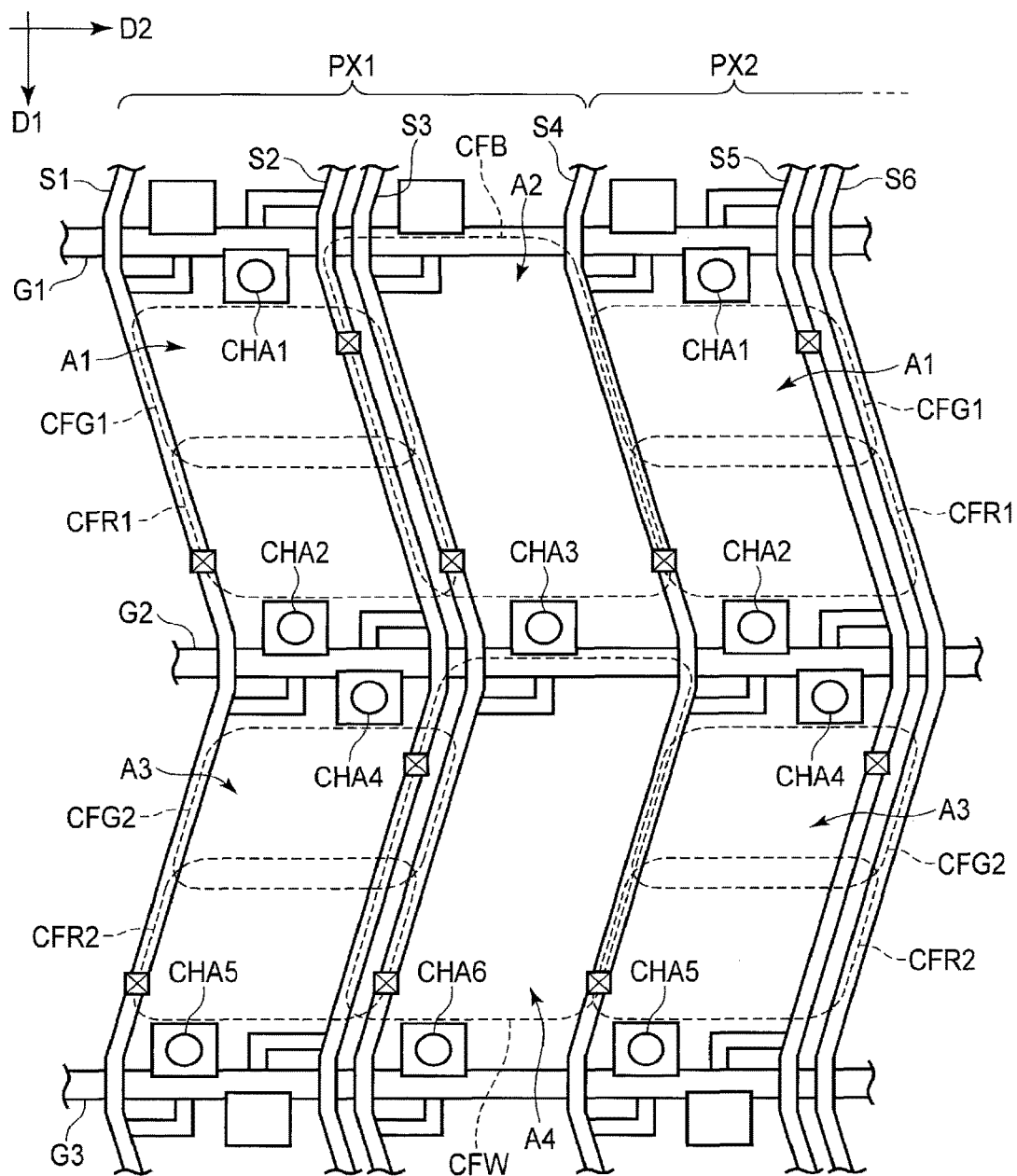
F I G. 16

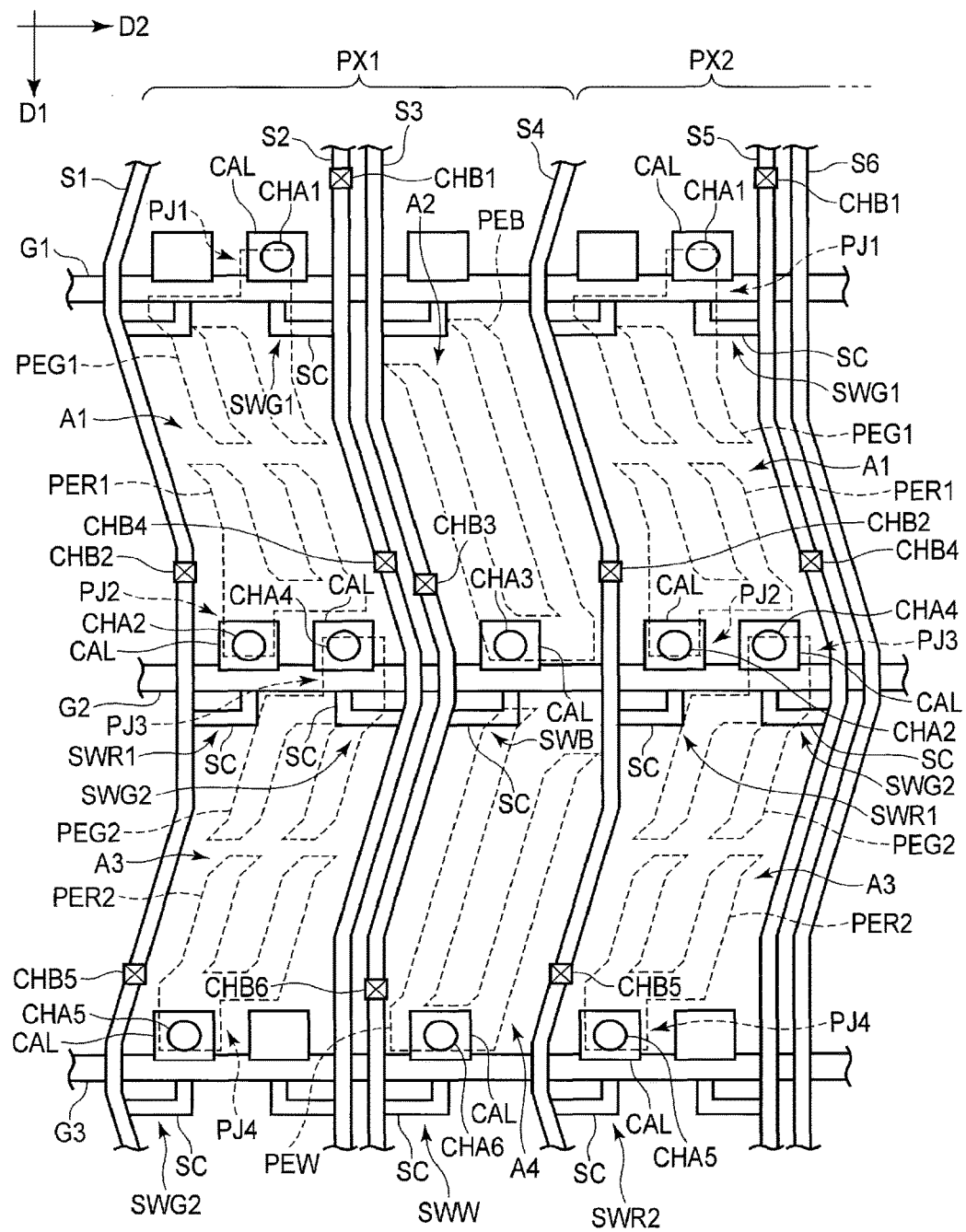
F I G. 18

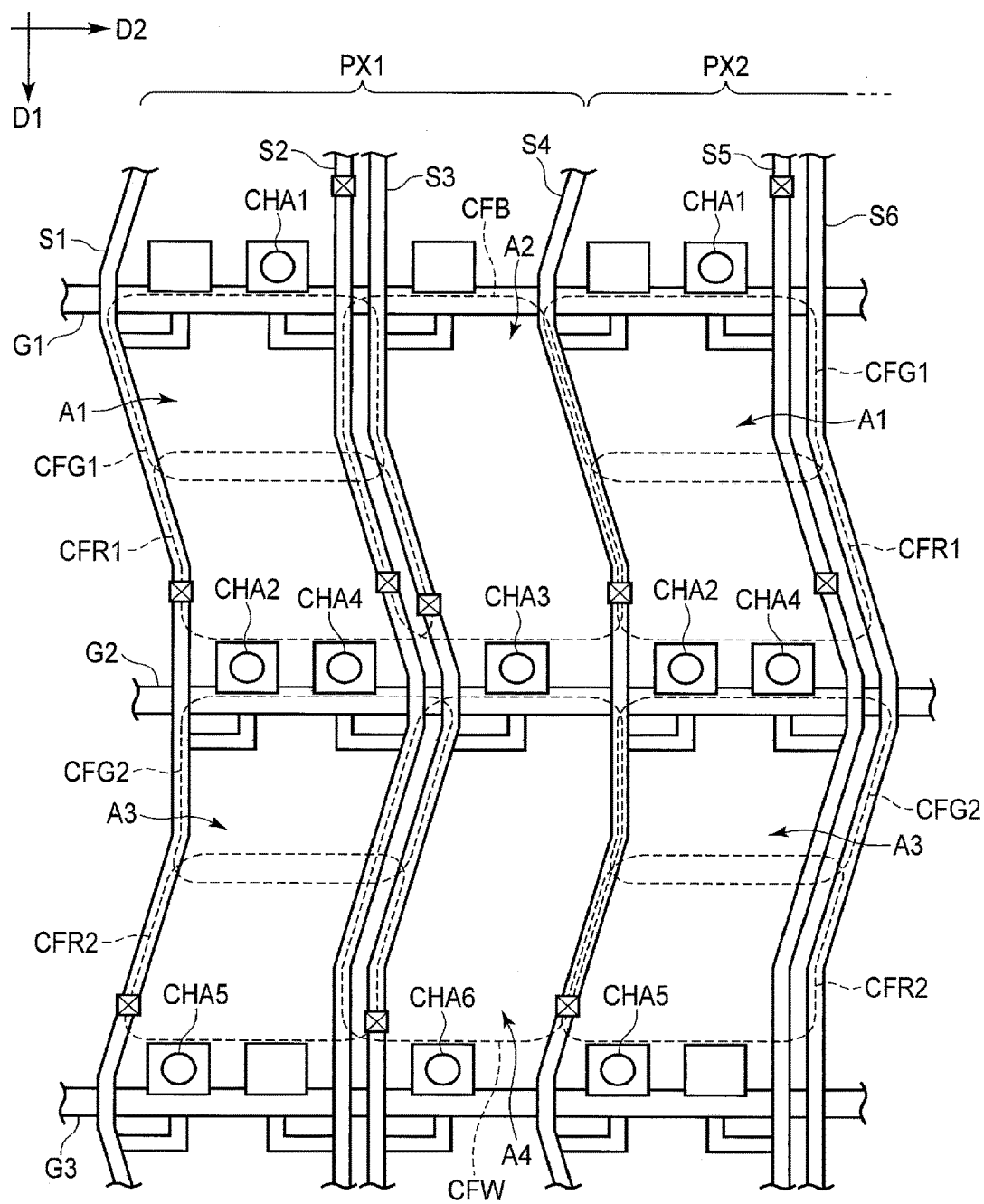
F I G. 19

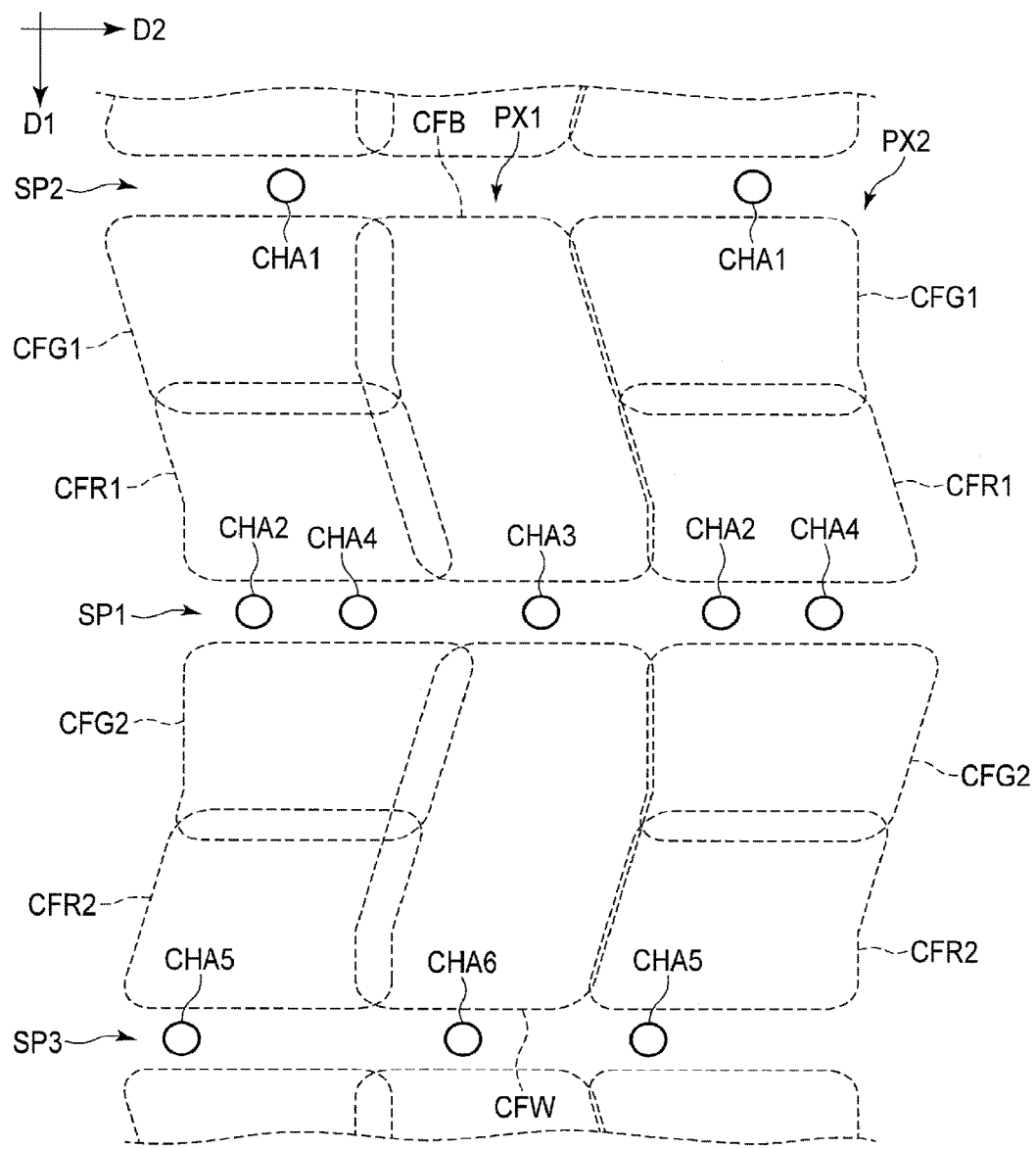
F I G. 20

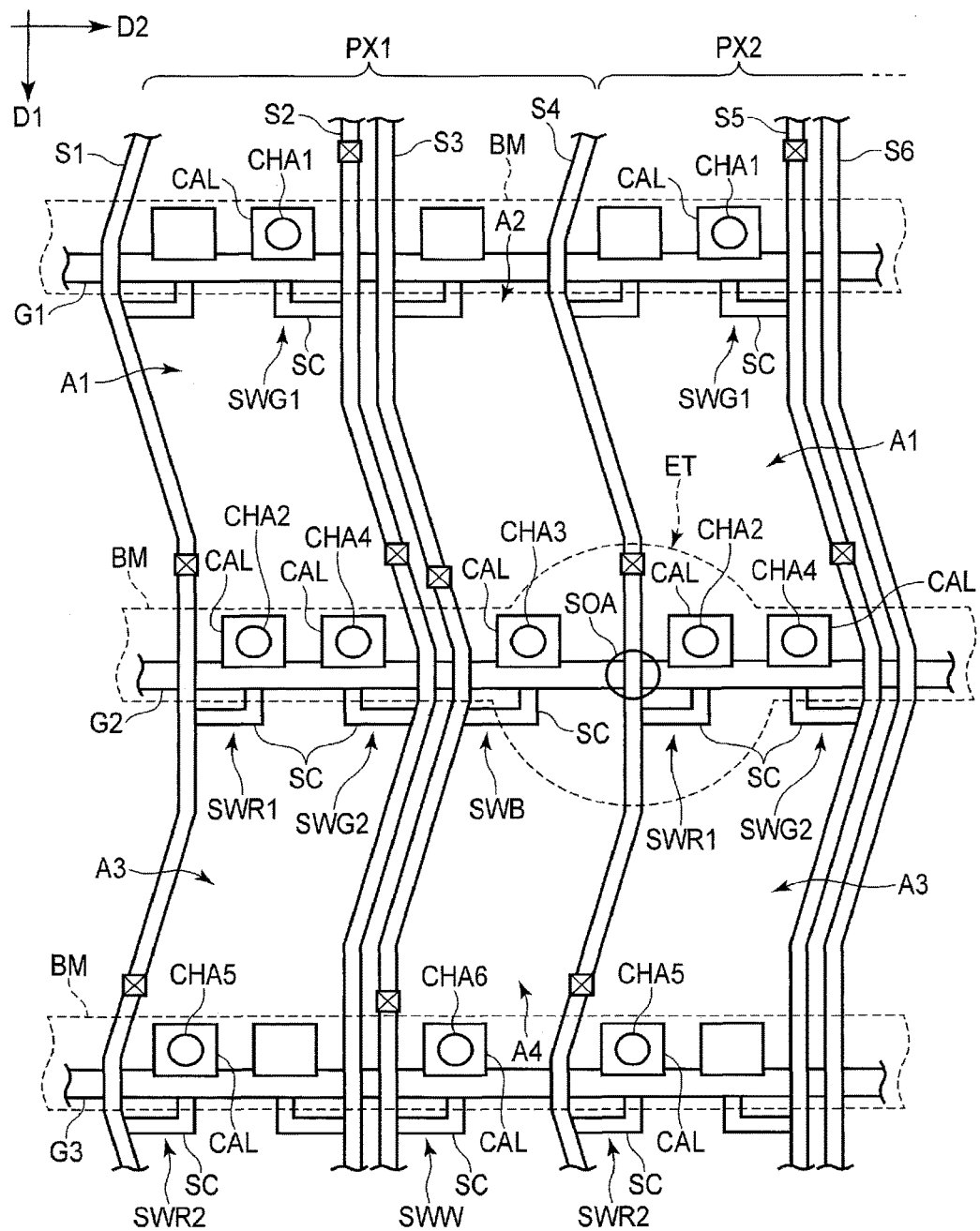
F I G. 21

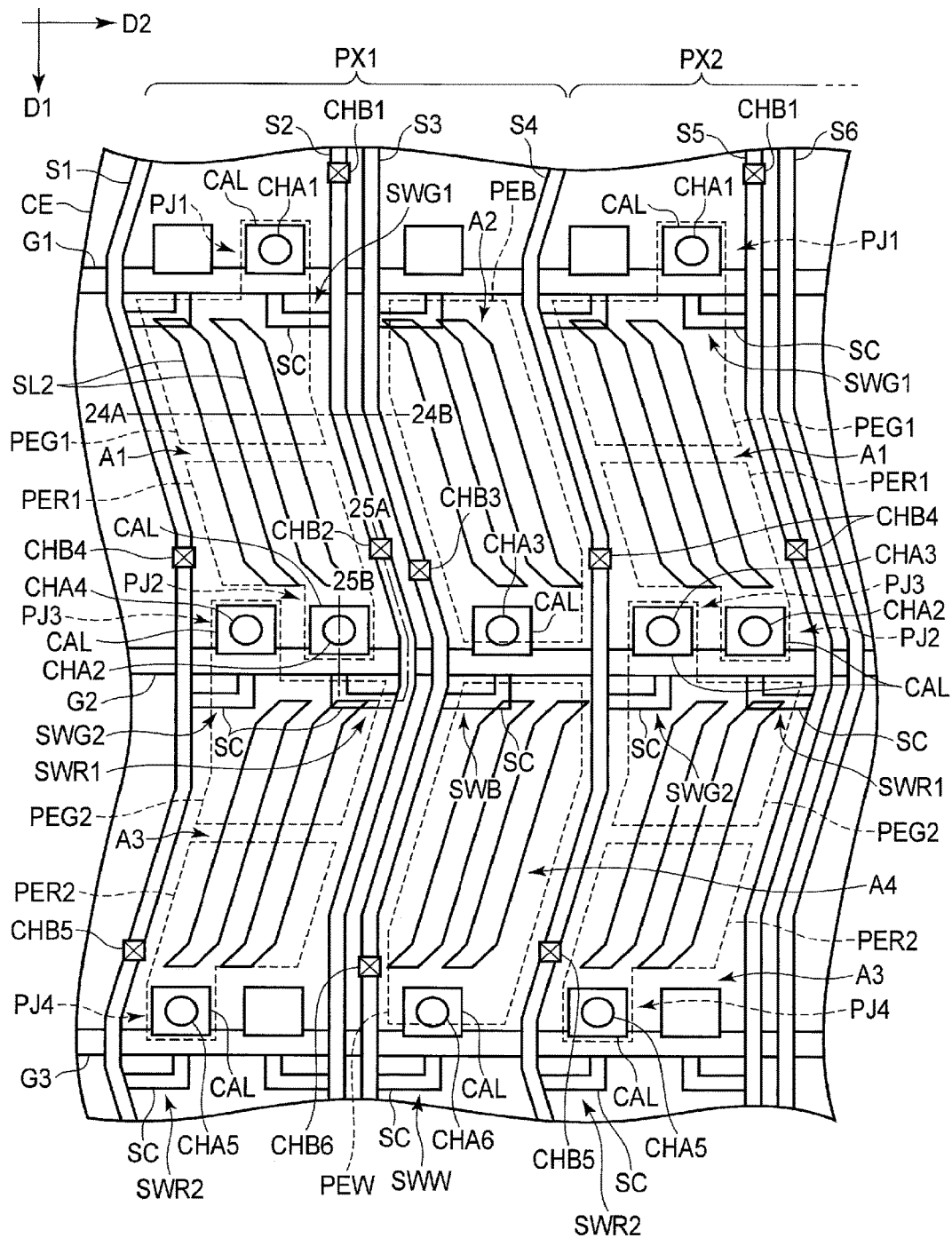
F I G. 23

COLOR FILTER SUBSTRATE AND DISPLAY DEVICE

CROSS-REFERENCE TO RELATED APPLICATIONS

This application is based upon and claims the benefit of priority from Japanese Patent Application No. 2014-242798, filed Dec. 1, 2014, the entire contents of which are incorporated herein by reference.

FIELD

Embodiments described herein relate generally to a color filter substrate and a display device.

BACKGROUND

Display devices such as liquid crystal display devices comprise a pair of substrates opposed to each other wherein switching elements and pixel electrodes are formed on one substrate and color filters are formed on the other substrate. Such a structure is becoming common.

However, in such a display device, if the substrates are misaligned in a layering process, the positional relationship between the pixel electrodes and the color filters is shifted. Thereby, a mixture of colors may occur in adjacent pixels, and nontransparent elements such as interconnects and light-shielding layers that originally should overlap in a plan view may be shifted and the aperture ratio may be decreased.

Furthermore, in recent years, display devices with higher definition have been demanded for image quality improvement. Display devices with higher definition require narrower pixels; however, as the pixels become narrower, misalignment of the pixel electrodes and the color filters may occur more and further affect the display quality.

BRIEF DESCRIPTION OF THE DRAWINGS

FIG. 3 shows an example of pixel arrangement in a display area of the display panel.

FIG. 4 shows an example of schematic equivalent circuit of the display panel.

FIG. 6 is a cross-sectional view which schematically shows the display panel taken along line 6A-6B of FIG. 5.

FIG. 11 shows a comparative example of the embodiment.

FIG. 12 shows color filters disposed on pixels of FIG. 11.

FIG. 14 shows high definition pixels in which a pixel width is smaller than that of the example of FIG. 13.

FIG. 15 is a cross-sectional view of a display panel of a COA scheme in which pixel electrodes and color filters are disposed on the same substrate.

FIG. 16 is a plan view which shows an example of the structure applicable to pixels of a display device of a second embodiment.

FIG. 18 is a plan view which shows an example of the structure applicable to pixels of a display device of a third embodiment.

FIG. 19 is a plan view which schematically shows an example of color filters disposed in pixels shown in FIG. 18.

FIG. 20 shows color filters and contact holes of FIG. 19.

FIG. 21 is a plan view which shows a positional relationship between a light-shielding layer and other elements.

FIG. 23 is a plan view which shows an example of the structure applicable to pixels of a display device of a fourth embodiment.

DETAILED DESCRIPTION

Figure 1:
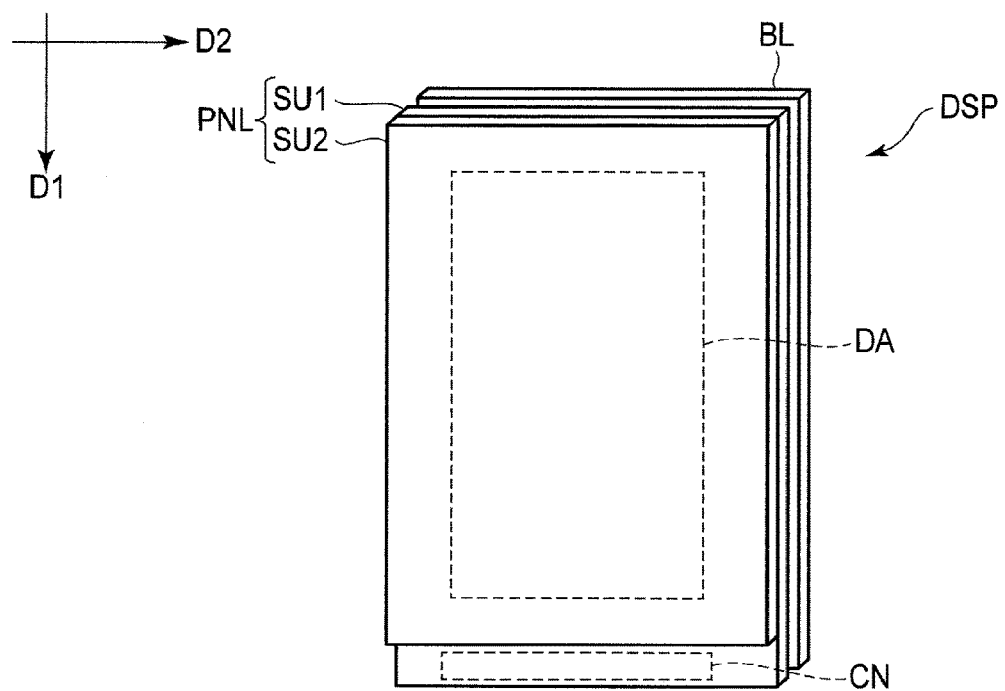
FIG. 1 schematically shows an example of an exterior of a liquid crystal display device of a first embodiment.

In general, according to one embodiment, a color filter includes an insulating substrate, first to fifth signal lines, first to third switching elements, first to third pixel electrodes, color filter layer, and insulating layer. The first signal line and the second signal line are arranged in the first direction and a first signal is supplied thereto. The third to fifth signal lines are arranged in a second direction crossing the first direction, to which a second signal which is different from the first signal is supplied, and cross the first signal line and the second signal line. The first pixel electrode is formed in a first area defined by the first, second, fourth, and fifth signal lines at the first signal line side. The second pixel electrode is formed in the first area at the second signal line side. The third pixel electrode is formed in a second area defined by the first to fourth signal lines to be adjacent to the first area. The color filter layer is disposed between each pixel electrode and the insulating substrate. The insulating layer covers the color filter layer and has first to third apertures. In such a color filter substrate, the first pixel electrode is electrically connected to the first switching element through the first aperture, the second pixel electrode is electrically connected to the second switching element through the second aperture, and the third pixel electrode is electrically connected to the third switching element through the third aperture. The first aperture is formed at the first signal line side, and the second aperture is formed at the second signal line side.

Furthermore, according to an embodiment, a display device includes a first substrate including the same structure as the color filter substrate and a second substrate opposed to the first substrate.

Hereinafter, the embodiment will be described with reference to the accompanying drawings.

Note that the disclosure is presented for the sake of exemplification, and any modification and variation conceived within the scope and spirit of the invention by a person having ordinary skill in the art are naturally encompassed in the scope of invention of the present application. Furthermore, the width, thickness, shape, and the like of each element are depicted schematically in the Figures as compared to actual embodiments for the sake of simpler explanation, and they are not to limit the interpretation of the invention of the present application. Furthermore, in the description and figures of the present application, structural elements having the same or similar functions will be referred to by the same reference numbers and detailed explanations of them that are considered redundant may be omitted.

In the embodiments, a liquid crystal display device is disclosed as an example of the display device. For example, the liquid crystal display device can be used in various devices such as smartphones, tablet computers, feature phones, notebook computers, TVs, in-car devices, and game consoles. Note that the main structures disclosed in the embodiments are applicable to various display devices such as a self-luminous display device with organic electroluminescent display elements and the like, an electronic paper display device with electrophoretic elements and the like, a display device utilizing micro-electromechanical systems (MEMS), and an electrochromic display device.

First Embodiment

The first embodiment will be explained. FIG. 1 schematically shows an example of an exterior of a liquid crystal display device DSP of the first embodiment. The liquid crystal display device DSP includes a display panel PNL and a backlight BL.

The display panel PNL includes a first substrate SU1, second substrate SU2, and liquid crystal layer (described later in the section related to liquid crystal layer LQ) held between the first substrate SU1 and the second substrate SU2. Furthermore, the display panel PNL includes a display area DA for image display. In the example of FIG. 1, the display area DA is a rectangle having long sides along a first direction D1 and short sides along a second direction D2 orthogonal to the first direction D1. However, the shape of the display area DA is not limited to a rectangle.

The first substrate SU1 includes a connector CN with an external connection terminal. The connector CN is connected to, for example, a flexible circuit board, and the liquid crystal display device DSP is electrically connected to an external module such as a control board of an electronic device via the flexible circuit board.

The backlight BL is positioned at the rear surface side of the first substrate SU1 (at the opposite surface of the surface facing the second substrate SU2) to face the display area DA. The backlight BL can be realized in various ways. For example, the backlight BL may include a light guide plate opposed to the first substrate SU1 and a light source including a plurality of light emitting diodes (LED) arranged along the edges of the light guide plate.

Figure 2:
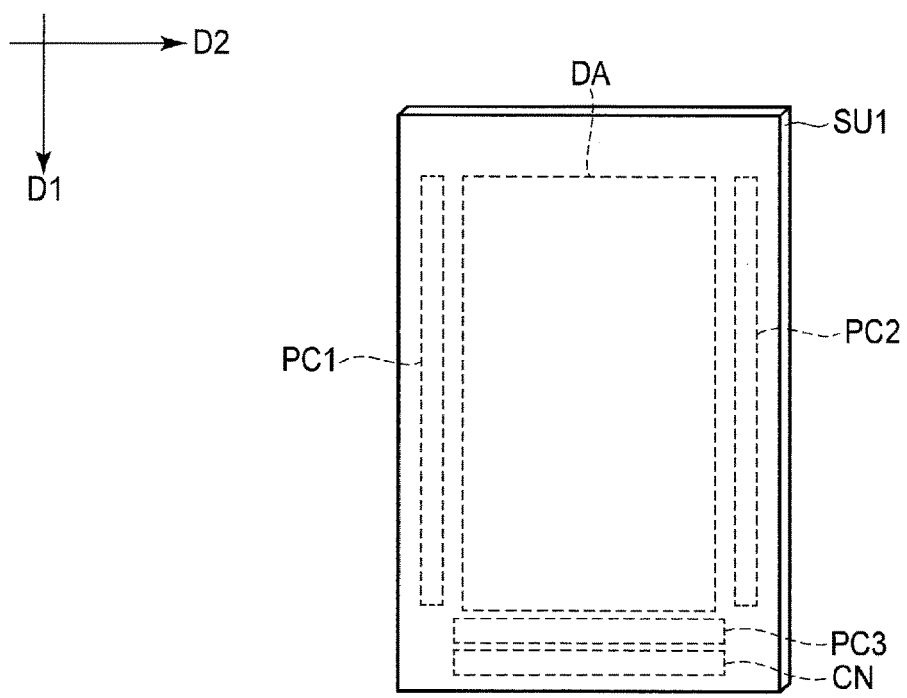
FIG. 2 schematically shows a first substrate of a display panel of the liquid crystal display device.

FIG. 2 schematically shows the surface of the first substrate SU1 facing the second substrate SU2. The first substrate SU1 includes the connector CN and drive circuits PC1, PC2, and PC3 on a peripheral area which does not overlap the display area DA. In the example of FIG. 2, drive circuits PC1 and PC2 are arranged along the long sides of the display area DA, and drive circuit PC3 is arranged along a short side of the display area DA.

A large number of pixels are formed in the display area DA. FIG. 3 shows an example of pixel arrangement. Note that a pixel is a minimum unit for color image display in the display area DA. In the figure, two kinds of pixels PX (PX1 and PX2) are shown. Both pixels PX1 and PX2 include a subpixel PXG1 corresponding to a first color, subpixel PXR1 corresponding to a second color, subpixel PXB corresponding to a third color, subpixel PXG2 corresponding to a fourth color, subpixel PXR2 corresponding to a fifth color, and subpixel PXW corresponding to a sixth color. In the present embodiment, a case where the first and fourth colors are green, the second and fifth colors are red, the third color is blue, and the sixth color is white is given. Pixels PX1 and PX2 may include subpixels corresponding to colors other than green, red, blue, and white and may be composed of subpixels corresponding to three colors other than green, red, and blue. Furthermore, in the display area DA, only one kind of pixel PX may be arranged or three or more kinds of pixels PX may be arranged.

Pixels PX1 are arranged in series along the first direction D1. Similarly, pixels PX2 are arranged in series along the first direction D1. The line of pixels PX1 along the first direction D1 and the line of pixels PX2 along the first direction D1 are arranged alternately along the second direction D2.

In pixels PX1 and PX2, subpixels PXG1 and PXR1 are adjacent in the first direction D1, and similarly, subpixels PXG2 and PXR2 are adjacent in the first direction D1. In pixel PX1, subpixels PXG1 and PXR1 are adjacent to subpixel PXB, and subpixels PXG2 and PXR2 are adjacent to subpixel PXW. On the other hand, in pixel PX2, subpixels PXG1 and PXR1 are adjacent to subpixel PXW and subpixel PXG2 and PXR2 are adjacent to subpixel PXB.

In the example of FIG. 3, subpixels PXG1, PXG2, PXR1, and PXR2 have a first area in pixels PX1 and PPX2, and subpixels PXB and PXW have a second area which is larger than the first area. For example, the second area is twice the first area.

The shape of subpixels PXG1, PXG2, PXR1, PXR2, PXB, and PXW is not limited particularly; however, a rectangle or a similar shape (in other words, a substantial rectangle) is suitable, and a parallelogram or a similar shape (in other words, a substantial parallelogram) is more suitable in consideration of visibility and tight pixel arrangement. Furthermore, the width of subpixels PXG1, PXG2, PXR1, PXR2, PXB, and PXW in the second direction D2 is substantially the same (for example, the ratio of lengths of the subpixels is maintained within a range of 0.8 to 1.2 times). Furthermore, the width of subpixels PXB and PXW in the first direction D1 is greater than the width of subpixels PXG1, PXG2, PXR1, and PXR2 in the first direction D1, and specifically it is twice in the example of FIG. 3.

In the retina of the human eye, the number of blue cones is greater than the number of green and red cones. That is, the eye is less sensitive to blue than to green and red. Pixels PX1 and PX2 in FIG. 3 cater to such characteristics of the eye. That is, the size of blue subpixel PXB and the size of white subpixel PXW which is generally bluish are set larger than the size of red subpixels PXR1 and PXR2, and the size of green subpixels PXG1 and PXG2, and the number of blue and white subpixels PXB and PXW is less than the number of the green and red subpixels PXG1, PXG2, PXR1, and PXR2. Consequently, the area of pixels PX1 and PX2 can be increased without practically lowering the resolving power.

FIG. 4 shows an example of a schematic equivalent circuit of the display panel PNL. The display panel PNL includes first signal lines arranged along the first direction D1 to which first signals are supplied and second signal lines arranged along the second direction D2 to which second signals are supplied. First and second signals are used to activate the pixels for image display, and in general, one is gate signals (scan signals) and the other is source signals (image signals). In FIG. 4, a plurality of gate lines G as first signal lines and a plurality of source lines S as second signal lines are shown. For example, counting from any end of the first direction D1, each odd-numbered gate line G is connected to a drive circuit PC1 and each even-numbered gate line G is connected to a drive circuit PC2. Each source line S is connected to a drive circuit PC3.

In FIG. 4, equivalent circuit of pixel PX1 is shown. In pixel PX1, subpixel PXG1 includes switching element SWG1 electrically connected to gate line G1 and source line S2, and pixel electrode PEG1 electrically connected to switching element SWG1. Subpixel PXR1 includes switching element SWR1 electrically connected to gate line G2 and source line S1, and pixel electrode PER1 electrically connected to switching element SWR1. Subpixel PXG2 includes switching element SWG2 electrically connected to gate line G2 and source line S2, and pixel electrode PEG2 electrically connected to switching element SWG2. Subpixel PXR2 includes switching element SWR2 electrically connected to gate line G3 and source line S1, and pixel electrode PER2 electrically connected to switching element SWR2. Subpixel PXB includes switching element SWB electrically connected to gate line G2 and source line S3, and pixel electrode PEB electrically connected to switching element SWB. Subpixel PXW includes switching element SWW electrically connected to gate line G3 and source line S3, and pixel electrode PEW electrically connected to switching element SWW. However, the connection of the switching elements SW (SWG1, SWG2, SWR1, SWR2, SWB, and SWW) of subpixels, gate lines G, and source lines S is not limited to the example of FIG. 4. Note that the switching element is an element that switches electrical characteristics of a resistance or the like and is typically a transistor such as a field-effect transistor (in the example of FIG. 4, field-effect transistors are adopted).

For example, each pixel electrode PE (PEG1, PEG2, PER1, PER2, PEB, and PEW) faces a common electrode CE. The common electrode CE is provided with, for example, a plurality of pixels PX and is electrically connected to a voltage supplier VS which supplies a common voltage.

Drive circuits PC1 and PC2 supply scan signals sequentially with respect to each gate line G. Drive circuit PC3 supplies image signals selectively with respect to each source line S. When both the scan signals and the image signals are input to switching elements SW, a field is produced between the pixel electrodes PE and the common electrodes CE connected to the switching element SW, and the alignment of liquid crystal molecules of the liquid crystal layer LQ held between the first substrate SU1 and the second substrate SU2 is changed by the field.

An equivalent circuit of pixel PX2 is the same as that of pixel PX1 except that the position of subpixels PXB is switched with the position of subpixels PXW.

The liquid crystal display device DSP structured as above is a transmissive liquid crystal display device which displays images on the display area DA by selectively passing light from the backlight BL through the display panel PNL pixel by pixel. However, the liquid crystal display device DSP may be a reflective liquid crystal display device which displays images using external light incident on the second substrate SU2, or a transflective liquid crystal display device having both functions of the transmissive display device and the reflective display device.

Figure 5:
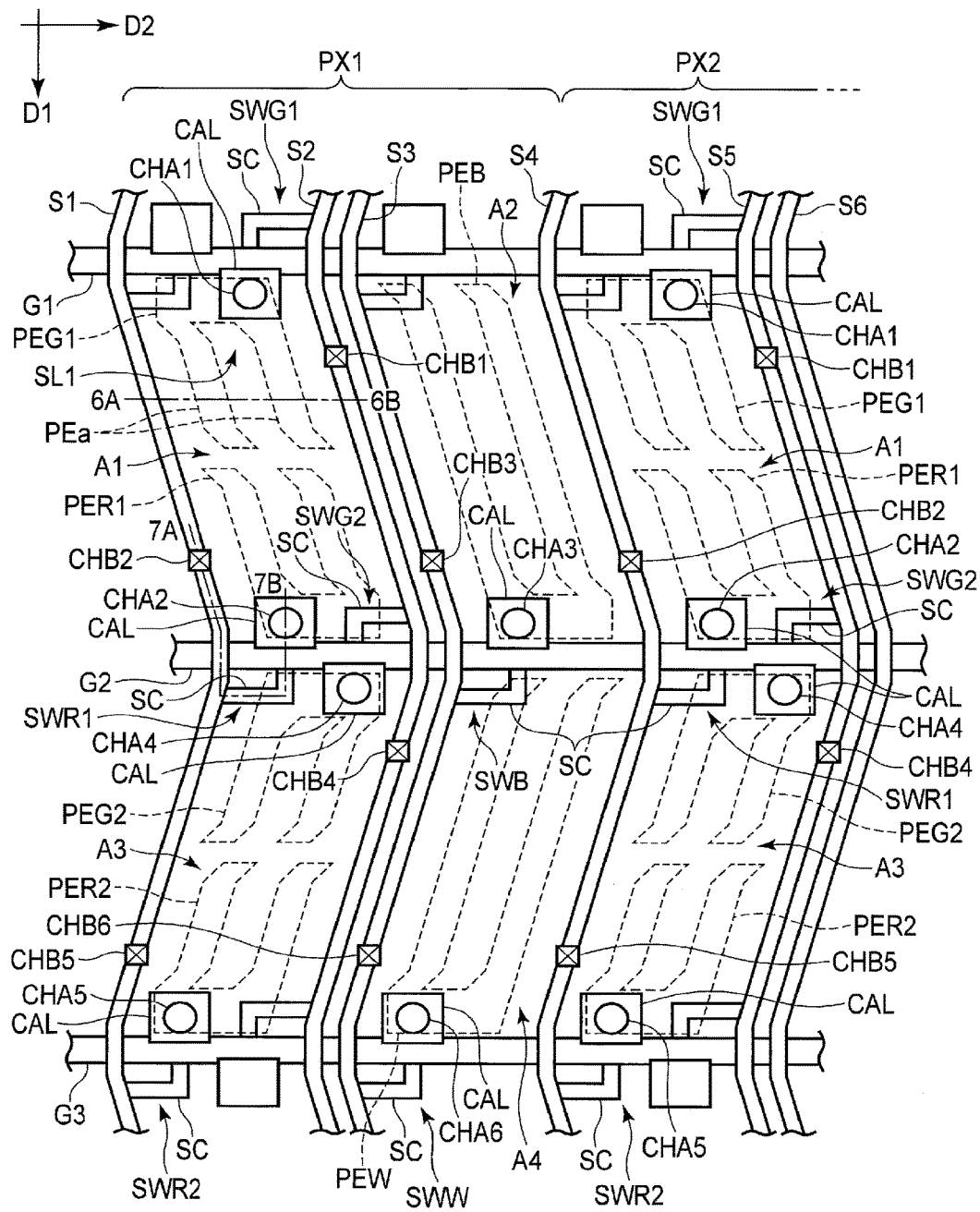
FIG. 5 is a plan view which shows an example of the structure applicable to pixels arranged in the display area.

FIG. 5 is a plan view which shows an example of the structure applicable to pixels PX1 and PX2. FIG. 5 shows subpixels PXG1, PXG2, PXR1, PXR2, PXB, and PXW in pixel PX1 and subpixels PXG1, PXG2, PXR1, and PXR2 in pixel PX2 adjacent to pixel PX1.

In the example of FIG. 5, three gate lines G (G1, G2, and G3) and six source lines S (S1, S2, S3, S4, S5, and S6) are shown. Gate lines G1, G2, and G3 extend linearly along the second direction D2 and arranged at regular intervals along the first direction D1. Source lines S1, S2, S3, S4, S5, and S6 extend linearly and parallel to each other inclining clockwise in the first direction D1 at an acute angle between the gate line G1 and gate line G2 and inclining clockwise in the first direction D1 at an obtuse angle between the gate line G2 and the gate line G3. Source lines S1, S2, S3, S4, S5, and S6 are arranged in the second direction D2. Furthermore, source line S2 and source line S3, and source line 5 and source line S6 are adjacent to each other in the second direction D2 without a subpixel interposed therebetween. On the other hand, source line S1 and source line S2, source line S3 and source line S4 are adjacent to each other in the second direction D2 with a subpixel interposed therebetween.

In pixel PX1, pixel electrode PEG1 of subpixel PXG1 and pixel electrode PER1 of subpixel PXR1 are disposed in an area A1 surrounded by gate lines G1 and G2 and source lines S1 and S2. In pixel PX1, pixel electrode PEB of subpixel PXB is disposed in an area A2 surrounded by gate lines G1 and G2 and source lines S3 and S4. In pixel PX1, pixel electrode PEG2 of subpixel PXG2 and pixel electrode PER2 of subpixel PXR2 are disposed in an area A3 surrounded by gate lines G2 and G3 and source lines S1 and S2. In pixel PX1, pixel electrode PEW of subpixel PXW is disposed in an area A4 surrounded by the gate lines G2 and G3 and source lines S3 and S4. Area A1 and area A2 are adjacent to each other in the second direction D2, area A1 and area A3 are adjacent to each other in the first direction D1, area A2 and area A4 are adjacent to each other in the first direction D1, area A3 and area A4 are adjacent to each other in the second direction D2. Furthermore, pixel electrodes PEG1 and PER1 are adjacent to each other in the first direction D1, pixel electrodes PEG1 and PER1 are adjacent to pixel electrode PEB in the second direction D2, pixel electrodes PEG2 and PER2 are adjacent to each other in the firsts direction D1, and pixel electrodes PEG2 and PER2 are adjacent to pixel electrode PEW in the second direction D2.

Note that, alternatively, area A1 may be defined as an area surrounded by gate lines G1 and G2 and source lines S1 and S3, area A2 may be defined as an area surrounded by gate lines G1 and G2 and source lines S2 and S4, area A3 may be defined as an area surrounded by gate lines G2 and G3 and source lines S1 and S3, and area A4 may be defined as an area surrounded by gate lines G2 and G3 and source lines S2 and S4.

In area A1, pixel electrode PEG1 is disposed at the gate line G1 side (in the proximity of gate line G1), and pixel electrode PER1 is disposed at the gate line G2 side (in the proximity of gate line G2). In area A3, pixel electrode PEG2 is disposed at the gate line G2 side (in the proximity of gate line G2) and pixel electrode PER2 is disposed at the gate line G3 side (in the proximity of gate line G3).

Pixel electrodes PEG1, PEG2, PER1, PER2, PEB, and PEW are disposed in areas A1 to A4 of pixel PX2 in a similar manner to pixel PX1. Details are substantially the same as that of pixel PX1 and are thus omitted.

In the example of FIG. 5, each of pixel electrodes PEG1, PEG2, PER1, PER2, PEB, and PEW has a slit SL1 and two comb electrodes PEa formed as bending belts with the slit SL1 interposed therebetween. Comb electrodes PEa extend to incline with respect to either the first direction D1 or the second direction D2 as a whole. Note that the pixel electrode may be a single electrode extending in a single direction.

Each of switching elements SWG1, SWG2, SWR1, SWR2, SWB, and SWW includes a semiconductor layer SC.

In pixel PX1, the semiconductor layer SC of switching element SWG1 is electrically connected to pixel electrode PEG1 at one end through a connection electrode CAL and contact hole CHA1 and is electrically connected to source line S2 at the other end through a contact hole CHB1.

The semiconductor layer SC of switching element SWR1 is similar to the above semiconductor layer SC of switching element SWG1. In this case, contact hole CHA1 corresponds to contact hole CHA2, contact hole CHB1 corresponds to contact hole CHB2, pixel electrode PEG1 corresponds to pixel electrode PER1, and source line S2 corresponds to source line S1.

The semiconductor layer SC of switching element SWB is similar to the above semiconductor layer SC of switching element SWG1. In this case, contact hole CHA1 corresponds to contact hole CHA3, contact hole CHB1 corresponds to contact hole CHB3, pixel electrode PEG1 corresponds to pixel electrode PEB, and source line S2 corresponds to source line S3.

The semiconductor layer SC of switching element SWG2 is similar to the above semiconductor layer SC of switching element SWG1. In this case, contact hole CHA1 corresponds to contact hole CHA4, contact hole CHB1 corresponds to contact hole CHB4, and pixel electrode PEG1 corresponds to pixel electrode PEG2.

The semiconductor layer SC of switching element SWR2 is similar to the above semiconductor layer SC of switching element SWG1. In this case, contact hole CHA1 corresponds to contact hole CHA5, contact hole CHB1 corresponds to contact hole CHB5, pixel electrode PEG1 corresponds to pixel electrode PER2, and source line S2 corresponds to source line S1.

The semiconductor layer SC of switching element SWW is similar to the above semiconductor layer SC of switching element SWG1. In this case, contact hole CHA1 corresponds to a contact hole CHA6, contact hole CHB1 corresponds to a contact hole CHB6, pixel electrode PEG1 corresponds to pixel electrode PEW, and source line S2 corresponds to source line S3.

Furthermore, in each corresponding area, contact hole CHA1 is formed at the gate line G1 side (in the proximity of gate line G1), contact holes CHA2, CHA3, and CHA4 are formed at the gate line G2 side (in the proximity of gate line G2), and contact holes CHA5 and CHA6 are formed at the gate line G3 side (in the proximity of gate line G3).

Furthermore, between gate lines G1 and G2, contact hole CHB1 is formed to overlap source line S2, contact hole CHB2 is formed to overlap source line S1, and contact hole CHB3 is formed to overlap source line S3. On the other hand, between gate lines G2 and G3, contact hole CHB4 is formed to overlap source line S2, contact hole CHB5 is formed to overlap source line S1, and contact hole CHB6 is formed to overlap source line S3.

The structure of pixel PX2 is substantially the same as that of pixel PX1 and the explanation is thus omitted.

In area A1, contact hole CHA1 and the connection electrode CAL of pixel PX2 are formed at the gate line G1 side (in the proximity of gate line G1), and contact hole CHB1 of pixel PX2 is formed to overlap source line S5 between gate lines G1 and G2. In area A1, contact hole CHA2 and the connection electrode CAL are formed at the gate line G2 side (in the proximity of gate line G2), and contact hole CHB2 of pixel PX2 is formed to overlap source line S4 between gate lines G1 and G2. In area A3, contact hole CHA4 and the connection electrode CAL of pixel PX2 are formed at the gate line G2 side (in the proximity of gate line G2), and contact hole CHB4 of pixel PX2 is formed to overlap source line S5 between gate lines G2 and G3. In area A3, contact hole CHA5 and the connection electrode CAL of pixel PX2 are formed at the gate line G3 side (in the proximity of gate line G3), and contact hole CHB5 of pixel PX2 is formed to overlap source line S4 between gate lines G2 and G3.

FIG. 6 is a schematic cross-sectional view which shows the display panel PNL taken along line 6A-6B of FIG. 5. The first substrate SU1 includes a first insulating substrate ISU1 such as a glass substrate or a resin substrate. The first insulating substrate ISU1 has a first surface F11 which is opposed to the second substrate SU2 and is covered with a first undercoat layer UC1. The first undercoat layer UC1 is covered with a second undercoat layer UC2. The first undercoat layer UC1 and the second undercoat layer UC2 are formed of a material such as silicon oxide (SiO) or silicon oxynitride (SiON). A first polarizer PL1 is disposed at a second surface F12 opposite to the first surface F11 of the first insulating substrate ISU1.

The second undercoat layer UC2 is covered with a first insulating layer IL1, and the first insulating layer IL1 is covered with a second insulating layer IL2. The first insulating layer IL1 and the second insulating layer IL2 are formed of a material such as silicon oxide (SiO) or silicon nitride (SiNi).

Source lines S (S1 and S2) are formed on the surface of the second insulating layer IL2 at the liquid crystal layer LQ side. Source lines S are covered with a color filter layer CFL. The color filter layer CFL also covers the second insulating layer IL2. The color filter layer CFL is covered with a third insulating layer IL3. In the example of FIG. 6, the color filter layer is depicted as a single layer; however, the color filter layer CFL includes a plurality of island-shaped color filters as described later with reference to FIG. 8.

The common electrode CE is formed on the surface of the third insulating layer IL3 at the liquid crystal layer LQ side. The common electrode CE is covered with a fourth insulating layer IL4 which is formed of, for example, silicon nitride. The pixel electrode PE (PEG1) is formed on the surface of the fourth insulating layer IL4 at the liquid crystal layer LQ side. That is, in the example of FIG. 6, the pixel electrode PE and common electrode CE are opposed to each other with the fourth insulating layer IL4 interposed therebetween. The pixel electrode PE and the fourth insulating layer IL4 are covered with a first alignment film AL1 contacting the liquid crystal layer LQ.

The pixel electrode PE and common electrode CE are formed of a transparent conductive material such as indium tin oxide (ITO).

On the other hand, the second substrate SU2 includes a second insulating substrate ISU2 such as a glass substrate or a resin substrate. The second insulating substrate ISU2 has a first surface F21 which is opposed to the first substrate SU1 and is covered with an overcoat layer OC. The overcoat layer OC is covered with a second alignment film AL2 contacting the liquid crystal layer LQ. The second insulating substrate ISU2 has a second surface F22 which is opposite to the first surface F21. A second polarizer PL2 is disposed on the second surface F22.

The first alignment film AL1 and the second alignment film AL2 are used for the alignment of liquid crystal molecules in the liquid crystal layer LQ. The first alignment film AL1 and the second alignment film AL2 are formed of a material such as polyimide organic high polymers and are subjected to an alignment treatment by a rubbing method. Or, the first alignment film AL1 and the second alignment film AL2 may be formed of a material such as photoreactive polyimide organic high polymers and are subjected to an alignment treatment by irradiating polarized ultraviolet ray thereon. In that case, the influence of the asperity of the surfaces of the first alignment film AL1 and the second alignment film AL2 on the alignment treatment can be blocked or reduced. The initial alignment state of the liquid crystal molecules is, for example, a homogeneous alignment state.

By applying a voltage between the pixel electrode PE and common electrode CE, a fringe field EF including components parallel to the main surfaces of the substrates (flat surfaces parallel to the first direction D1 and the second direction D2) is produced. The liquid crystal molecules of the liquid crystal layer LQ rotate in parallel to the main surfaces of the substrates. Note that, in the present embodiment, the pixel electrode PE and common electrode CE are arranged such that a fringe field EF which is a kind of transverse field schemes is produced therein; however, no limitation is intended thereby. Vertical field schemes and oblique field schemes are applicable to the embodiment of the present application and the arrangement of the pixel electrode PE and common electrode CE should be arbitrarily determined to correspond to a desired field.

FIG. 6 is a cross-sectional view of the display panel PNL focusing on subpixel PXG1; however, the same structure and function are applicable to the other subpixels PXG2, PXR1, PXR2, PXB, and PXW with pixel electrodes PEG2, PER1, PER2, PEB, and PEW.

Figure 7:
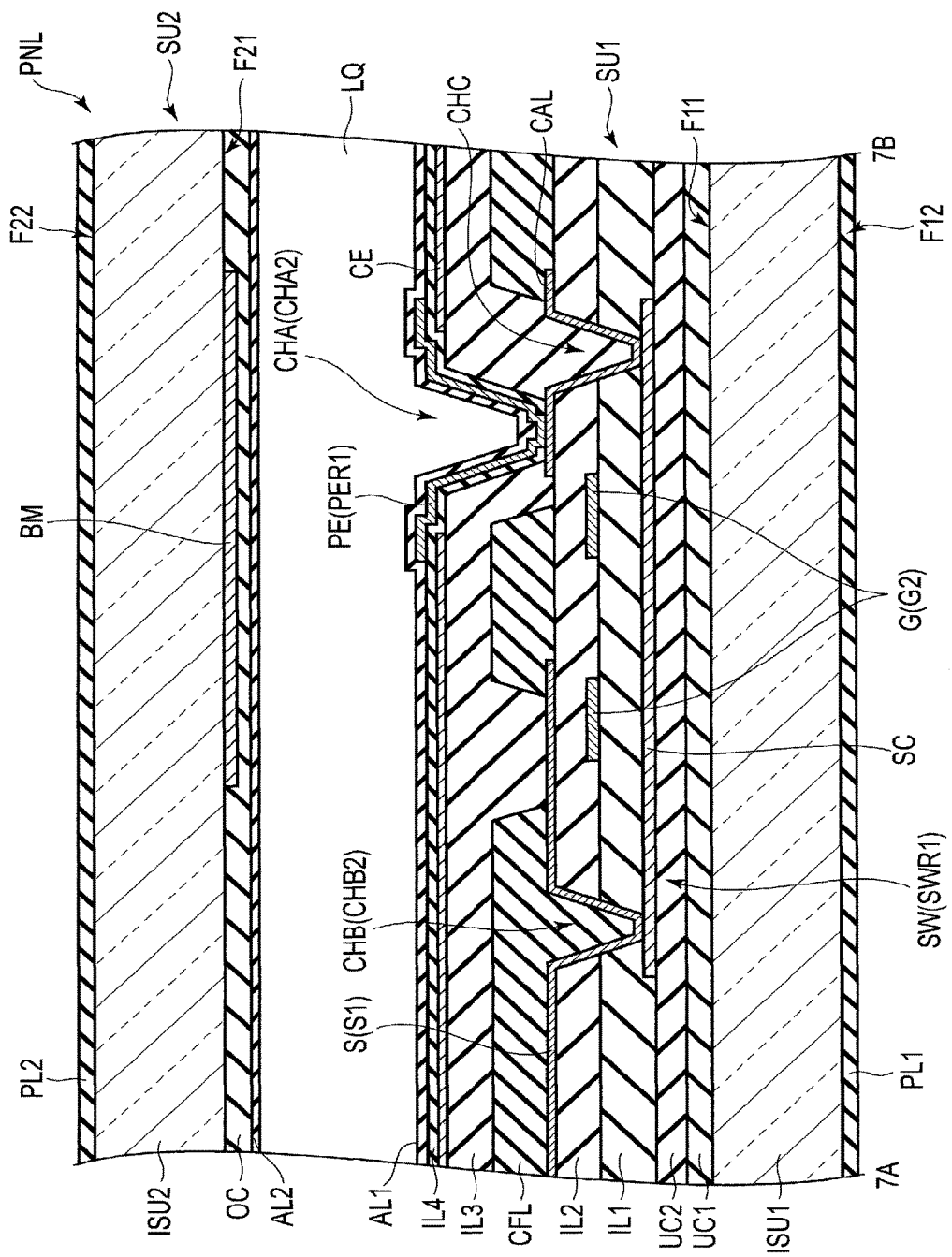
FIG. 7 is a cross-sectional view which schematically shows the display panel taken along line 7A-7B of FIG. 5.

FIG. 7 is a schematic cross-sectional view of the display panel PNL taken along line 7A-7B of FIG. 5. The semiconductor layer SC of the switching element SW (SWR1) is formed on the surface of the second undercoat layer UC2 at the liquid crystal layer LQ side. The semiconductor layer SC is formed of a material such as polysilicon. A light-shielding layer opposed to the semiconductor layer SC may be provided between the first insulating substrate ISU1 and the first undercoat layer UC1, or between the first undercoat layer UC1 and the second undercoat layer UC2 to prevent light from the backlight BL on the semiconductor layer SC.

In the example of FIG. 7, a contact hole CHB (CHB2) is pierced through the first insulating layer IL1 and the second insulating layer IL2. The source line S (S1) contacts the semiconductor layer SC through contact hole CHB.

The connection electrode CAL contacts the semiconductor layer SC through a contact hole CHC. Connection hole CHC is a combination of a through-hole in the first insulating layer IL1 and a through-hole in the second insulating layer IL2. The connection electrode CAL and the source line S are formed in the same layer. The connection electrode CAL and the source line S have a three-layer structure including, for example, aluminum or aluminum alloy interposed two titanium layers or titanium alloy layers.

The gate line G (G2) is formed on the surface of the first insulating layer IL1 at the liquid crystal layer LQ side and is covered with the second insulating layer IL2. The gate line G is formed of a material such as molybdenum tungsten (MoW) alloy.

In the examples of FIGS. 5 to 7, a top-gate and double-gate thin-film transistor is shown as an example of the switching element SW; however, the switching element SW is not limited to such a thin-film transistor. For example, the switching element SW may be, for example, a single-gate thin-film transistor or a bottom-gate thin-film transistor.

The pixel electrode PE (PER1) contacts the connection electrode CAL through a contact hole CHA (CHA2). In the example of FIG. 7, the contact hole CHA is pierced through the color filter layer CFL, third insulting layer IL3, fourth insulating layer IL4, and common electrode CE.

In a cross-sectional view of the contact hole CHA (CHA2 in the example of FIG. 7), the fourth insulating layer IL4 is positioned at the innermost of the contact hole CHA, the third insulating layer IL3 is outside thereof, and the common electrode CE and the edges of the color filter CFL are outside thereof. In the contact hole CHA the fourth insulating layer IL4 is covered with the pixel electrode PE. In the contact hole CHA structured as above in a cross-sectional view, the color filter layer CFL is covered with the pixel electrode PE, fourth insulating layer IL4, and third insulating layer IL3, and thus, even if impurities are contained in the color filter layer CFL, transference of the impurities to the liquid crystal layer LQ can be prevented effectively.

For example, a gap in the color filter CFL has a width of approximately 8 µm at the bottom side near the second insulating layer IL2 and a width of approximately 10 µm at the top side near the liquid crystal layer LQ. A hole in the third insulating layer IL3 has a diameter of approximately 4 µm at the bottom side near the second insulating layer IL2 and a diameter of approximately 6 µm at the top side near the liquid crystal layer LQ. A hole in the fourth insulating layer IL4 has a diameter of approximately 3 µm.

A light-shielding layer BM is formed on the first surface F21 of the second insulating substrate ISU2 to be opposed to the contact hole CHA and the gate line G. The light-shielding layer BM is covered with the overcoat layer OC.

FIG. 7 is a cross-sectional view of the display panel PNL focusing on subpixel PXR1; however, the same structure and function are applicable to the other subpixels PXG1, PXG2, PXR2, PXB, and PXW with pixel electrodes PEG1, PEG2, PER2, PEB, and PEW, switching elements SWG1, SWG2, SWR2, SWB, and SWW, contact holes CHA1, and CHA3 to CHA6, and contact holes CHB1, and CHB3 to CHB6.

Connections holes CHA1, CHA2, CHA3, CHA4, CHA5, and CHA6 are examples of through-holes formed on the third insulating layer IL3: first aperture, second aperture, third aperture, fourth aperture, fifth aperture, and sixth aperture, respectively.

As shown in FIGS. 6 and 7, in the present embodiment, the color filter layer CFL is provided with the first substrate SU1. That is, the liquid crystal display device DSP is based on a color-filter-on-array (COA) scheme and the first substrate SU1 is a color filter substrate including both the switching element SW and the color filter layer CFL.

Figure 8:
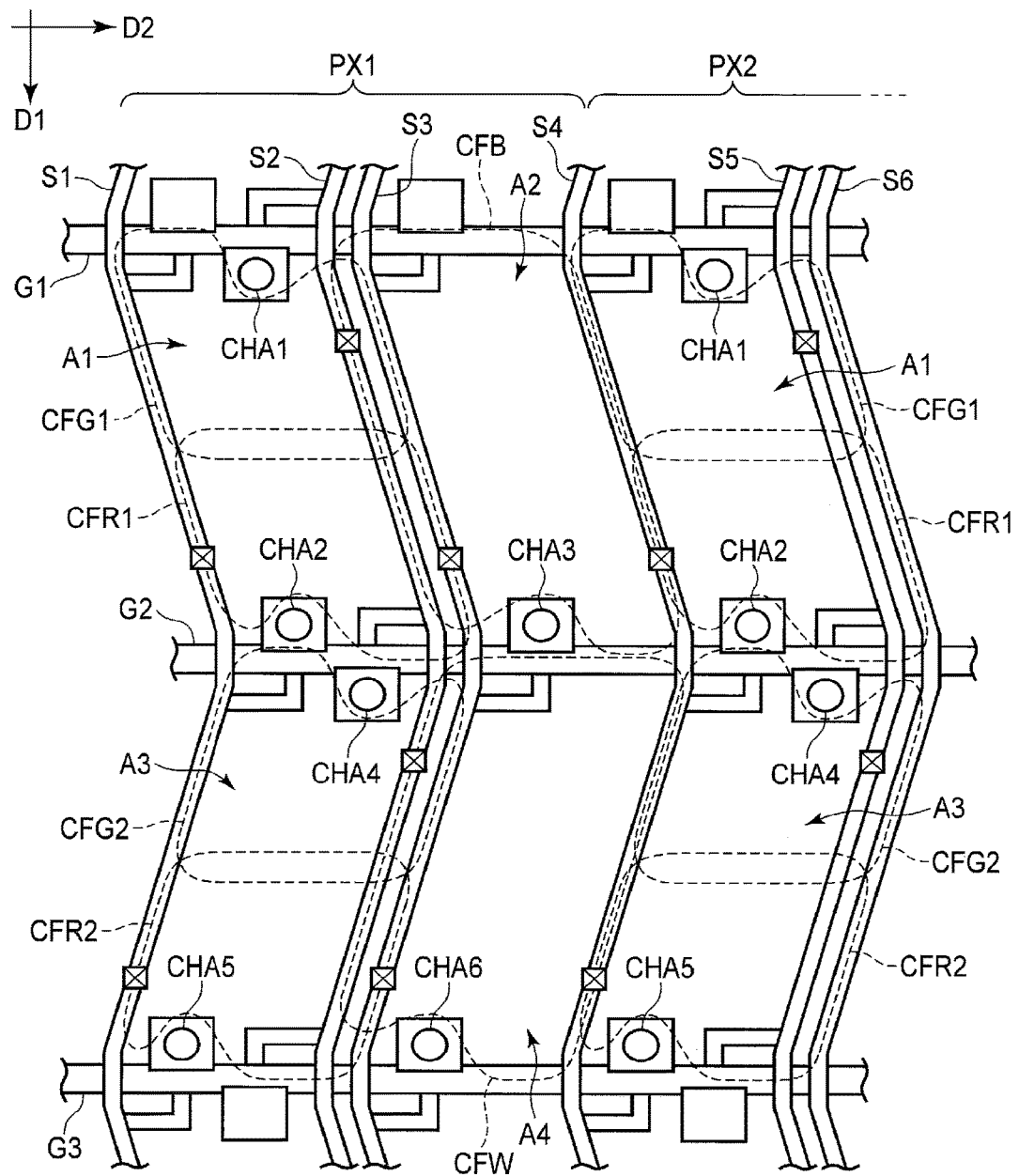
FIG. 8 is a plan view which schematically shows shapes of color filters arranged in the pixels of FIG. 5.

The color filter layer CFL includes a plurality of color filters corresponding to different colors. FIG. 8 is a schematic plan view showing an example of the shape of color filters CF (CFG1, CFG2, CFR1, CFR2, CFB, and CFW) arranged in pixels PX1 and PX2 of FIG. 5.

Note that, in the figure, color filter CFG1 is opposed to pixel electrode PEG1, color filter CFG2 is opposed to pixel electrode PEG2, color filter CFR1 is opposed to pixel electrode PER1, color filter CFR2 is opposed to pixel electrode PER2, color filter CFB is opposed to pixel electrode PEB, and color filter CFW is opposed to pixel electrode PEW.

Color filters CFG1 and CFG2 are formed of an organic resin material with a green pigment, for example. Color filters CFR1 and CFR2 are formed of an organic resin material with a red pigment, for example. Color filter CFB is formed of an organic resin material with a blue pigment, for example. Color filter CFW is formed of an organic resin material which is substantially colorless. Color filters CFG1, CFG2, CFR1, CFR2, CFB, and CFW have the same thickness, for example. Note that color filter CFW may be omitted in subpixel PXW; however, in that case, flattening of the color filter layer CFL by the third insulating layer IL3 may not be performed sufficiently, and the thickness of the liquid crystal layer LQ increases at subpixel PXW, and the display color of subpixel PXW may become yellowish. That is, color filter CFW keeps the thickness of subpixel PXW the same as that of the other subpixels and prevents the display color thereof from being tinted.

Color filters CFG1 and CFR1 are arranged in area A1. In pixel PX1, one end of color filter CFG1 in the first direction D1 overlaps gate line G1 except the proximity of contact hole CHA1, and the other end is positioned in the proximity of the center of area A1 in the first direction D1. Furthermore, one end of color filter CFG1 in the second direction D2 overlaps source line S1 and the other end overlaps source line S3. In pixel PX1, one end of color filter CFR1 in the first direction D1 overlaps gate line G2 except the proximity of contact hole CHA2, and the other end is positioned in the proximity of the center of area A1 in the first direction D1. Furthermore, one end of color filter CFR1 in the second direction D2 overlaps source line S1 and the other end overlaps source line S3.

Color filter CFB is arranged in area A2. In pixel PX1, one end of color filter CFB in the first direction D1 overlaps gate line G1 and the other end overlaps gate line G2 except the proximity of contact hole CHA5. Furthermore, one end of color filter CFB in the second direction D2 overlaps source line S2 and the other end overlaps source line S4.

Color filters CFG2 and CFR2 are arranged in area A3. In pixel PX1, one end of color filter CFG2 in the first direction D1 overlaps gate line G2 except the proximity of contact hole CHA4, and the other end is positioned in the proximity of the center of area A3 in the first direction D1. Furthermore, one end of color filter CFG2 in the second direction D2 overlaps source line S1 and the other end overlaps source line S3. In pixel PX1, one end of color filter CFR2 in the first direction D1 overlaps gate line G3 except the proximity of contact hole CHA5, and the other end is positioned in the proximity of the center of area A3 in the first direction D1. Furthermore, one end of color filter CFR2 in the second direction D2 overlaps source line S1 and the other end overlaps source line S3.

Color filter CFW is arranged in area A4. In pixel PX1, one end of color filter CFW in the first direction D1 overlaps gate line G2 and the other end overlaps gate line G3 except the proximity of contact hole CHA6. Furthermore, one end of color filter CFW in the second direction D2 overlaps source line S2 and the other end overlaps source line S4.

In the example of FIG. 8, color filters CFG1 and CFR1 overlap each other in the proximity of the center of area A1 in the first direction D1 (near the border of subpixels PXG1 and PXR1), and color filters CFG2 and CFR2 overlap each other in the proximity of the center of area A3 in the first direction D1 (near the border of subpixels PXG2 and PXR2). Furthermore, color filters CFG1, CFR1, and CFB overlap each other in the proximity of source lines S2 and S3, and color filters CFG2, CFR2, and CFW overlap each other in the proximity of source lines S2 and S3.

Furthermore, a distance from the center point of a contact hole CHA and ends of color filters CF adjacent with respect to the contact hole CHA should be set as even as possible. In the example of FIG. 8, a distance from the center point of contact hole CHA2 to the end of color filter CFR1 should be set as even as possible with a distance from the center point of contact hole CHA2 to the end of color filter CFG2.

Color filters in pixel PX2 are substantially the same as color filters of pixel PX1 and the explanation thereof is omitted.

In the example of FIG. 8, color filter CFB of pixel PX1 and color filters CFG1 and CFR1 of pixel PX2 overlap each other in the proximity of source line S4, and color filter CFW of pixel PX1 and floor filters CFG2 and CFR2 of pixel PX2 overlap each other in the proximity of source line S4.

Figure 9:
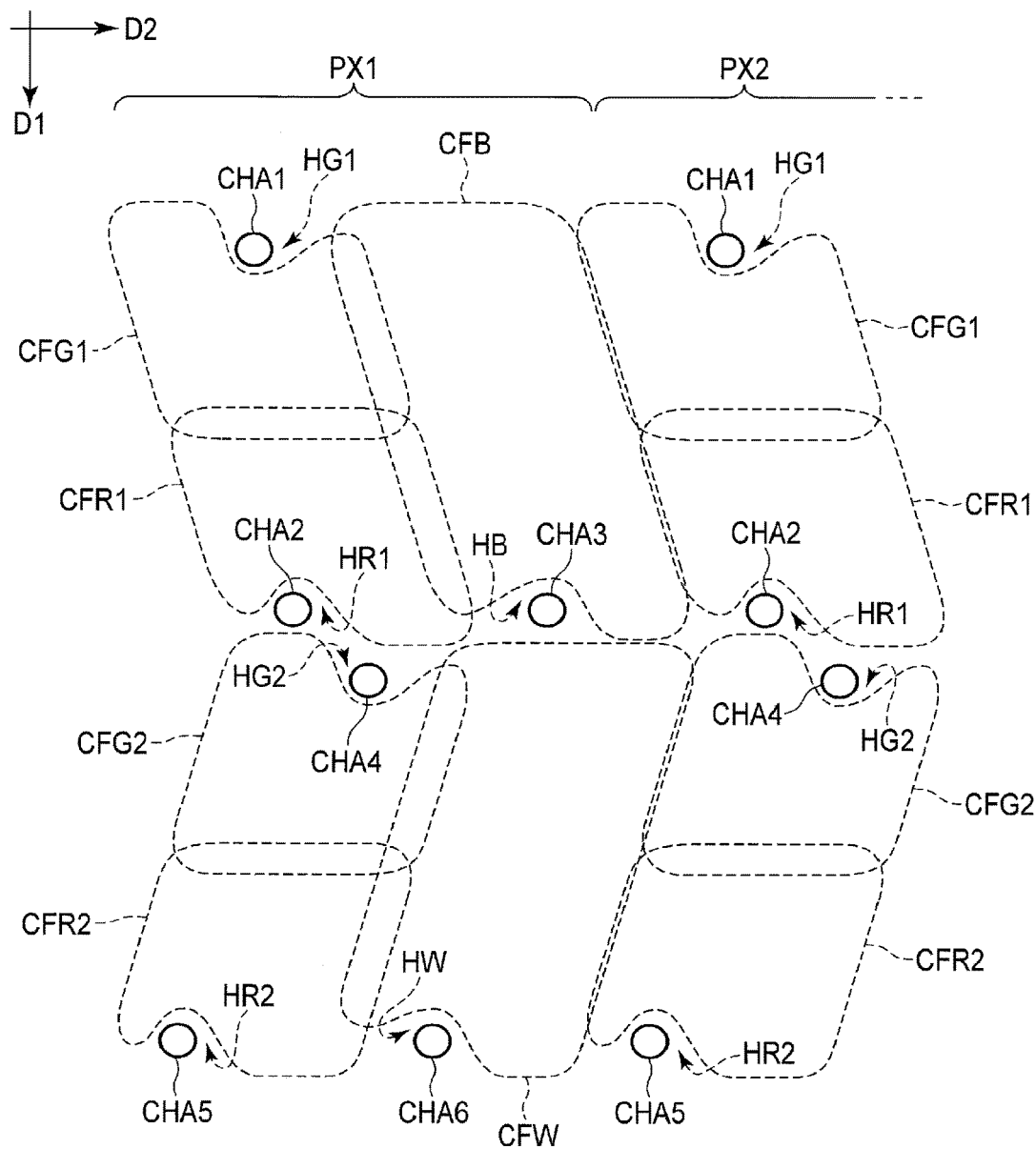
FIG. 9 shows color filters and contact holes of FIG. 8.

FIG. 9 shows color filters CFG1, CFG2, CFR1, CFR2, CFB, and CFW and contact holes CHA1 to CHA6 of FIG. 8. Color filters CFG1, CFG2, CFR1, CFR2, CFB, and CFW are formed as islands and color filters of the same color do not contact.

In the example of FIG. 9, color filter CFB and color filter CFW are larger in size than any of color filters CFG1, CFG2, CFR1, and CFR2.

Color filters CFG1, CFG2, CFR1, CFR2, CFB, and CFW are shaped to be similar to their corresponding areas A1 to A4. In the example of FIG. 8, each color filter has a parallelogram-like shape with rounded corners. Furthermore, each color filter has a recess in its circumference in a plan view.

Specifically, color filter CFG1 has recess HG1, color filter CFG2 has recess HG2, color filter CFR1 has recess HR1, color filter CFR2 has recess HR2, color filter CFB has recess HB, and color filter CFW has recess HW.

Thus, contact hole CHA1 is formed in the recess HG1, contact hole CHA2 is formed in recess HR1, contact hole CHA3 is formed in recess HB, contact hole CHA4 is formed in recess HG2, contact hole CHA5 is formed in recess HR2, and contact hole CHA6 is formed in recess HW.

As can be understood from the above, contact holes CHA1 to CHA6 are disposed not to overlap any of color filters CFG1, CFG2, CFR1, CFR2, CFB, and CFW in a plan view.

Figure 10:
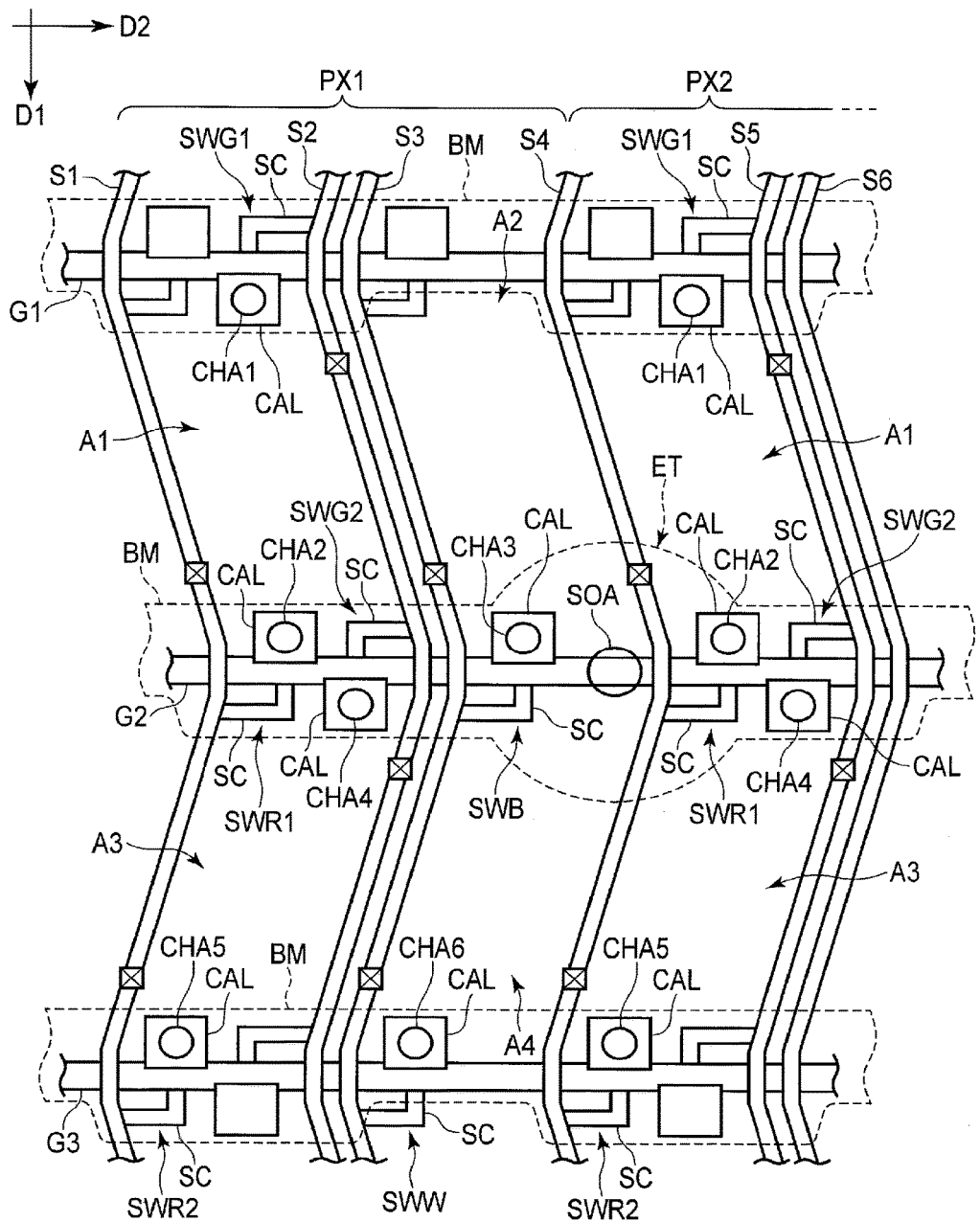
FIG. 10 is a plan view which shows a positional relationship between the light-shielding layer of FIG. 7 and other elements.

FIG. 10 shows a positional relationship between the light-shielding layer BM of FIG. 7 and elements such as gate lines G (G1 to G3), source lines (S1 to S6), contact holes CHA1 to CHA6, and connection electrodes CAL.

The light-shielding layer BM is provided with each gate line G and extends in the second direction D2 along with gate line G. The light-shielding layer BM overlaps gate line G, contact holes CHA1 to CHA6, and connection electrodes CAL in a plan view.

The light-shielding layer BM prevents reflection of light from the second substrate SU2 side on corresponding gate line G and connection electrodes CAL and improves the display image quality. Note that, in the example of FIG. 10, source lines S are exposed from the light-shielding layer BM; however, color filters CFG1, CFG2, CFR1, CFR2, and CFB overlap each other in the proximity of source lines S as in FIG. 8, and light reflection by source lines S can be suppressed. Note that a light reflection protection may be applied to source lines S. For example, an anti-reflection film formed of a conductive and lower reflective material such as titanium nitride (TiN) may be formed on the surface of source line S at the second substrate SU2 side to prevent light reflection by source lines S. For example, the thickness of such a TiN film may be approximately 40 nm.

In the example of FIG. 10, spacer SOA is provided with a position overlapping gate line G2. Spacer SOA is positioning in the liquid crystal layer LQ to maintain the thickness of the liquid crystal layer LQ. Spacer SOA is provided with the first substrate SU1 or the second substrate SU2. For example, the height of spacer SOA is approximately 4 μm, and the diameter thereof is approximately 6 μm. There are a large number of spacers SOA provided with the positions of the display panel PNL overlapping gate lines G.

The light-shielding layer BM has an enlarged part ET which is enlarged in size to overlap a circular range having a certain diameter with spacer SOA as the center. The enlarged part ET can prevent light leakage caused by disturbance in the alignment of liquid crystal molecules around spacer SOA. Furthermore, the first substrate SU1 and the second substrate SU2 may be shifted to be rubbed against each other around spacer SOA and may cause disturbance in the alignment of liquid crystal molecules. The enlarged part ET can prevent light leakage caused by such disturbance in the alignment.

Then, an example of effects achieved by the present embodiment will be explained.

FIG. 11 shows a comparative example of the present embodiment and shows pixels PXa arranged in the first direction D1. Pixel PXa includes red subpixel PXRa, green subpixel PXGa, and blue subpixel PXBa. Subpixels PXRa, PXGa, and PXBa are arranged in the second direction D2.

FIG. 12 shows color filters arranged on pixels PXa of FIG. 11. Continuous color filter CFRa is disposed to correspond to subpixels PXRa arranged in the first direction D1, continuous color filter CFGa is disposed to correspond to subpixels PXGa arranged in the first direction D1, and continuous color filter CFBa is disposed to correspond to subpixels PXBa arranged in the first direction D1.

Here, subpixels PXRa, PXGa, and PXBa of the comparative example are prepared to have the same definition as in subpixels PXG1, PXG2, PXR1, PXR2, PXB, and PXW of the liquid crystal display device DSP of the present embodiment. In this case, pixel PXa of FIG. 11 includes three subpixels in the second direction D while pixels PX1 and PX2 of FIG. 3 or the like include only two subpixels in the second direction D2. Thus, pixel PXa has a width in the second direction D2 which is approximately 1.5 times the width in the second direction D2 of each of pixels PX1 and PX2.

That is, with the structure of the present embodiment, a relatively large width can be secured for each pixel even if the definition of pixels is increased. Consequently, for example, color mixture of adjacent pixels can be prevented as detailed below.

The color mixture is a phenomenon which causes asymmetric polar angle dependency of a hue of a color displayed by a pixel. If the color mixture increases, a pixel displaying red is recognized as red when being viewed in a normal of the display surface while it may be recognized as green when being viewed from an area of a high polar angle. The color mixture occurs when light incident on the display panel obliquely with respect to the normal direction of the main surface of the display panel passes through a color filter and a pixel area which are unmatched.

Figure 13:
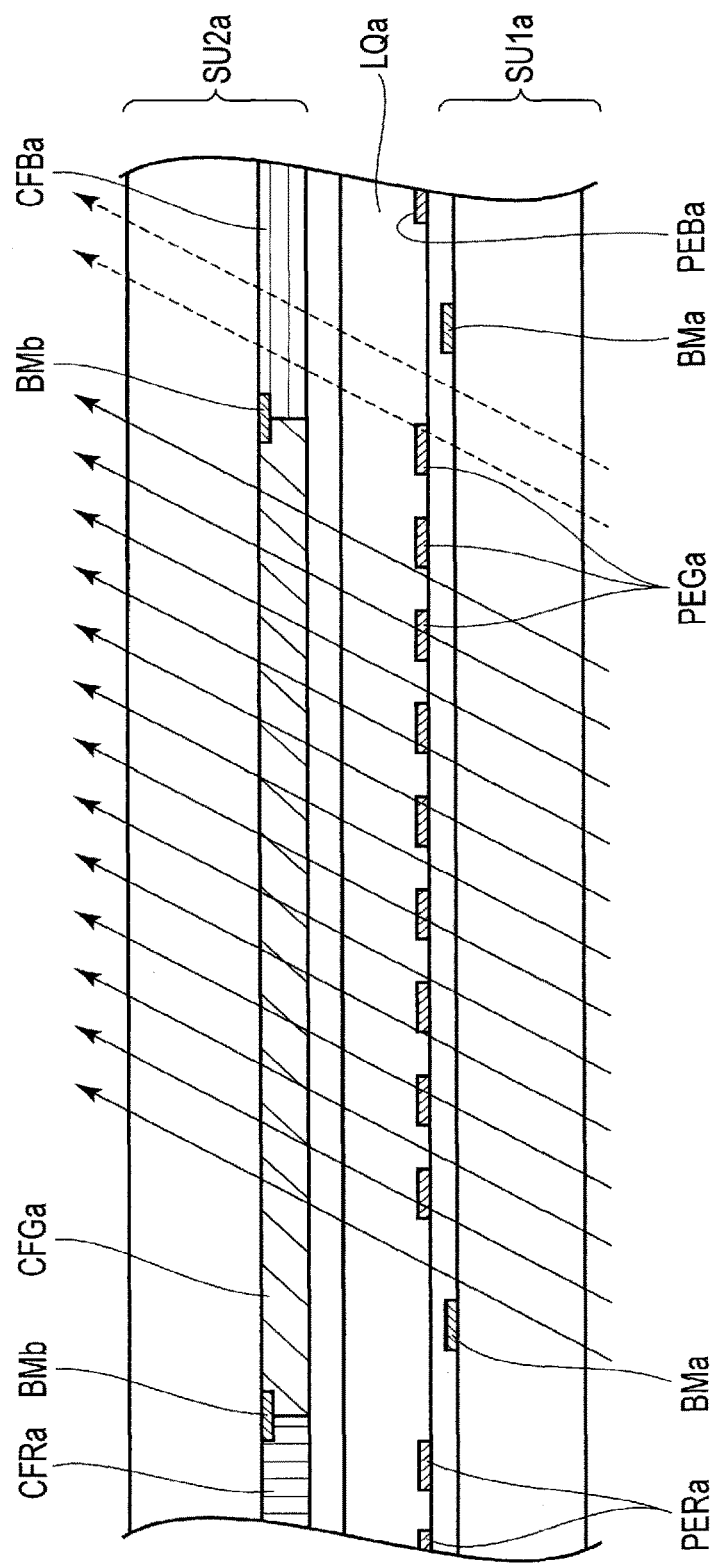
FIG. 13 is a cross-sectional view of a display panel in which pixel electrodes and color filters are disposed on different substrates.

FIG. 13 is a cross-sectional view of a display panel including pixel electrodes and color filters provided with different substrates. Pixel electrodes PERa, PEGa, and PEBa are provided with a first substrate SU1a, and color filters CFRa, CFGa, and CFBa are provided with a second substrate SU2a which is opposed to the first substrate SU1a with a liquid crystal layer LQa interposed therebetween where color filters CFRa, CFGa, and CFBa correspond to pixel electrodes PERa, PEGa, and PEBa, respectively. Furthermore, light-shielding layers BMa are provided with the first substrate SU1a to correspond to borders of subpixels, and light-shielding layers BMb are provided with the second substrate SU2a to correspond to borders of subpixels. In the example of FIG. 13, color filter CFGa and pixel electrodes PEGa are attached to be a slightly shifted from their originally desired positions.

Here, a case where green subpixels corresponding to pixel electrodes PEGa and color filter CFGa are lit is given. Light from the backlight is obliquely incident on the first substrate SU1a and partly (as depicted in solid line arrows) passes through a gap between light-shielding layers BMa and color filter CFGa to display green. On the other hand, light from the backlight is obliquely incident on the first substrate SU1a and partly (as depicted in dotted line arrows) passes through a gap between light-shielding layers BMa and then color filter CFBa of an adjacent pixel to display blue. Thus, the color mixture occurs. That is, if the substrate on which pixel electrodes are formed and the substrate on which color filters are formed are separated, a positional shift tends to occur in an attachment process and this causes the color mixture. Therefore, pixel electrodes and color filters should be formed on the same substrate. If they are formed on the same substrate, degraded display performance caused by a positional shift in the attachment of the first substrate SU1 and the second substrate SU2 can be suppressed.

FIG. 14 shows a display panel with high definition pixels in which a pixel width is smaller than that of the example of FIG. 13. Here, out of light passing between light-shielding layers BMa, a relatively large amount thereof passes through the color filter CFB, and the color mixture increases.

FIG. 15 shows a cross-sectional view of a display panel of a COA scheme in which pixel electrodes and color filters are disposed on the same substrate as in the present embodiment. That is, pixel electrodes PERa, PEGa, and PEBa and color filters CFRa, CFGa, and CFBa are formed on a first substrate SU1a.

Generally, tolerance in positioning between different substrates is approximately 2.5 μm which is large while tolerance in positioning between two different layers formed on the same substrate is approximately 1.0 μm which is very small. Therefore, in the example of FIG. 15, if there is a shift in the attachment process of the first substrate SU1a and the second substrate SU2a, a shift between pixel electrodes PERa, PEGa, and PEBa and color filters CFRa, CFGa, and CFBa can be suppressed. Furthermore, in the examples of FIGS. 13 and 14, a liquid crystal layer LQa is interposed between pixel electrodes PERa, PEGa, and PEBa and color filters CFRa, CFGa, and CFBa while there is not a liquid crystal layer interposed therebetween in the example of FIG. 15. Thus, even if a shift occurs between pixel electrodes and color filters, a mismatch of lighting depicted by dotted line arrows as shown in FIGS. 13 and 14 does not easily occur. This advantage can be achieved in the structure of the present embodiment.

Furthermore, the display panel PNL of COA scheme as in the present embodiment has a good aperture ratio. That is, since the color mixture can be suppressed with the structure of COA scheme as described above, an area of the light-shielding layer BM disposed on the second substrate SU2 can be reduced. Furthermore, since an antireflection film is formed on the surface of source lines S and the ends of the color filters overlap each other as described above, a light-shielding layer overlapping source lines S is not required. With the improvement of the aperture ratio, the luminosity of the liquid crystal display device DSP can be increased.

Furthermore, a degraded contrast ratio at the time of using the liquid crystal display device DSP in a bright condition can be suppressed.

Furthermore, as described above, the aperture ratio can be improved without degrading the image resolution in the pixel structure shown in FIG. 3 and the like.

As can be understood from the above, the present embodiment can present a high definition liquid crystal display device DSP with less color mixture and improved aperture ratio and a color filter substrate used in such a liquid crystal display device DSP.

In general, a color filter has a relatively large thickness of approximately 1.5 μm and is photoabsorbable, and thus, it is less suitable for a treatment. Therefore, if holes corresponding to contact holes CHA1 to CHA6 are provided with color filters CFG1, CFG2, CFR1, CFR2, CFB, and CFW in a color filter layer CFL, there is difficulty in forming such a hole with a small diameter. Furthermore, if the color filter is a negative resist, parts to be pierced as the contact holes are surrounded by exposed parts in a photolithograph process, and a polymerization reaction may possibly occur in the parts to be pierced if light from any direction reaches thereto. In this case, a residue may be produced in a contact hole formed after an etching process and electric connection through the contact hole may be blocked.

In contrast, holes corresponding to contact holes CHA1 to CHA6 are not provided with color filters CFG1, CFG2, CFR1, CFR2, CFB, or CFW, and such as adverse effect caused by the color filter treatment can be suppressed.

The third insulating layer IL3 is a transparent organic film and is prepared based on a positive resist which includes a solvent. Thus, the third insulating layer IL3 has certain fluidity immediately after its application. Therefore, the third insulating layer IL3 becomes thicker at positions with underlying color filters and becomes thinner at positions without any underlying color filter. However, a sufficient flattening effect may not be achieved sometimes and a cavity may be produced in a position without an underlying color filter. In the proximity of such a cavity, a gap between a connection electrode and a common electrode CE formed on the surface of the third insulating layer IL3 at the liquid crystal layer LQ side is decreased and a parasitic capacitance may possibly be increased. In consideration of this point, recesses HG1, HG2, HR1, HR2, HB, and HW are provided with color filters CFG1, CFG2, CFR1, CFR2, CFB, and CFW in the present embodiment as shown in FIG. 9, and contact holes CHA1 to CHA6 are formed to correspond to the positions of the recesses. Therefore, an area of a cavity can be decreased and parasitic capacitance can be decreased.

Moreover, since contact hole CHA1 is formed at gate line G1 side while contact hole CHA2 is formed at gate line G2 side, pixel electrodes PEG1 and PER1 can be disposed in a large space in area A1. Similarly, since contact hole CHA4 is formed at the gate line G2 side while contact hole CHA5 is formed at gate line G3 side, pixel electrodes PEG2 and PER2 can be disposed in a large space in area A3. Thereby, the light-shielding layer BM can be made narrower and the aperture ratio can be improved.

Second Embodiment

Now, the second embodiment will be described. The structures and effects already described in the section related to the first embodiment will be omitted.

FIG. 16 shows an example of the structure applicable to pixels PX1 and PX2 of a liquid crystal display device DSP of the present embodiment. As in FIG. 8, FIG. 16 shows subpixels PXG1, PXG2, PXR1, PXR2, PXB, and PXW of pixel PX1 and subpixels PXG1, PXG2, PXR1, and PXR2 of pixel PX2.

In the present embodiment, color filter CFG1 does not overlap gate line G1, color filter CFR1 does not overlap gate line G2, color filter CFG2 does not overlap gate line G2, color filter CFR2 does not overlap gate line G3, color filter CFB does not overlap gate line G2, and color filter CFW does not overlap gate line G3.

Figure 17:
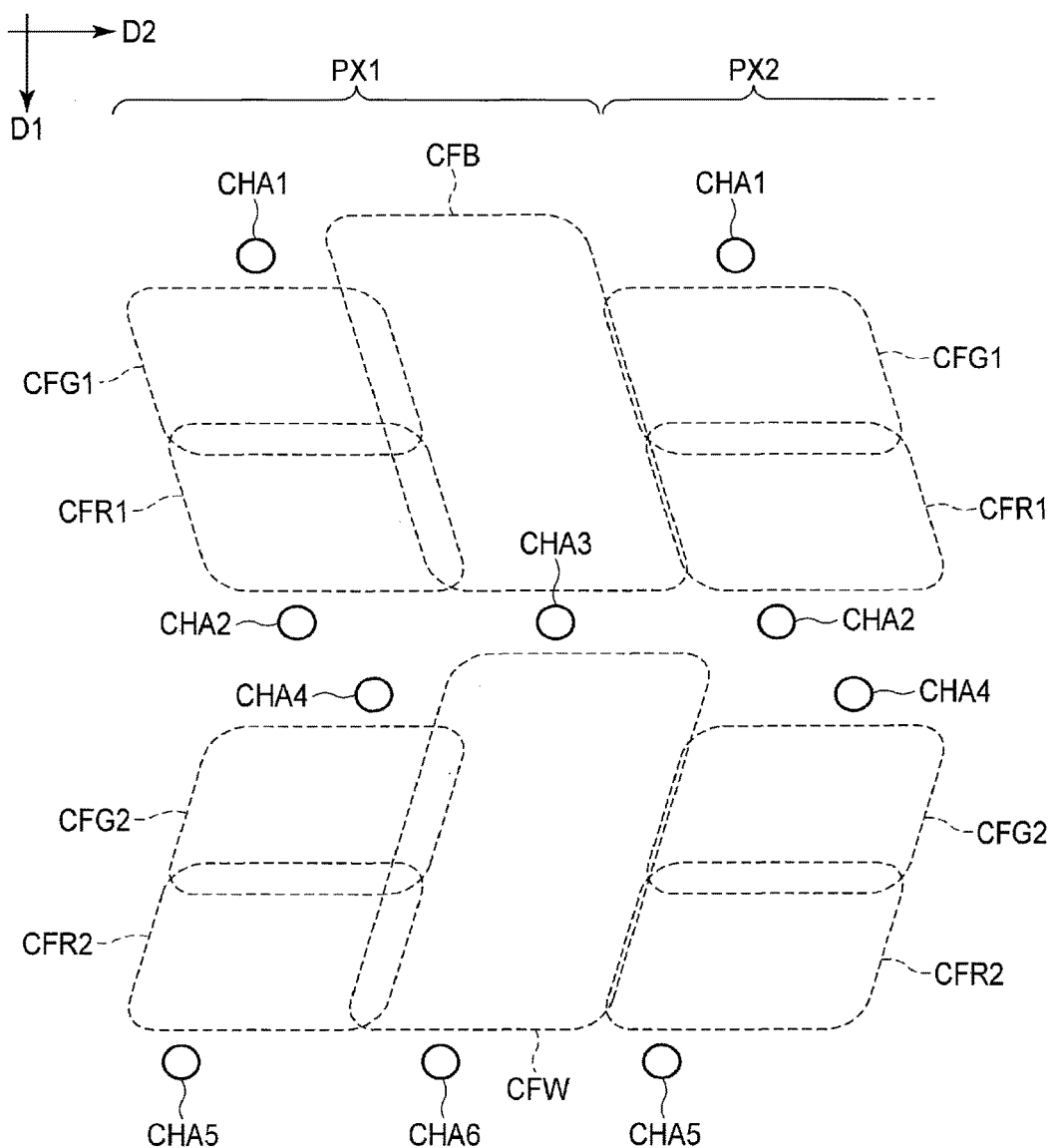
FIG. 17 shows color filters and contact holes of FIG. 16.

FIG. 17 shows color filters CFG1, CFG2, CFR1, CFR2, CFB, and CFW and contact holes CHA1 to CHA6 in FIG. 16. Color filters CFG1, CFG2, CFR1, CFR2, CFB, and CFW do not have recesses HG1, HG2, HR1, HR2, HB, and HW of FIG. 9 and each have a simple parallelogram-like shape. Connection holes CHA1 to CHA6 are positioned as in the first embodiment.

Color filters CFG1, CFG2, CFR1, CFR2, CFB, and CFW formed as above can easily be manufactured as compared to a case where recesses HG1, HG2, HR1, HR2, HB, and HW are provided therewith.

Third Embodiment

Now, the third embodiment will be described. The structures and effects already described in the sections related to the first and second embodiments will be omitted.

FIG. 18 shows an example of the structure applicable to pixels PX1 and PX2 of a liquid crystal display device DSP of the present embodiment. As in FIG. 5, FIG. 18 shows subpixels PXG1, PXG2, PXR1, PXR2, PXB, and PXW of pixel PX1 and subpixels PXG1, PXG2, PXR1, and PXR2 of pixel PX2. Hereinafter, points different from the structure shown in FIG. 5 will be explained mainly.

In the example of FIG. 18, in both pixels PX1 and PX2, each contact hole CHA1 is formed at the opposite side of area A1 over gate line G1 and near source line S2 (in the proximity of source line S2) and each contact hole CHA4 is formed at the opposite side of area A3 over gate line G2 (that is, area A1) and near source line S2 (in the proximity of source line S2). Furthermore, connection electrodes CAL corresponding to connections holes CHA1 and CHA4 are formed the same positions corresponding thereto.

Furthermore, in the example of FIG. 18, in both pixels PX1 and PX2, each contact hole CHB1 is not formed between gate lines G1 and G2 but at the opposite position over gate line G1 and each contact hole CHB4 is not formed between gate lines G2 and G3 but at the opposite position over gate line G2 (that is, between gate lines G1 and G2). Semiconductor layer SC of switching element SWG1 extends between contact holes CHA1 and CHB1 and twice crosses gate line G1. Semiconductor layer SC of switching element SWG2 extends between contact holes CHA4 and CHB4 and twice crosses gate line G2.

Pixel electrode PEG1 has a projection PJ1 crossing gate line G1 and extending toward contact hole CHA1. Pixel electrode PER1 has a projection PJ2 disposed to be apart from contact hole CHA4 and extending toward contact hole CHA2. Pixel electrode PEG2 has a projection PJ3 crossing gate line G2 and extending toward contact hole CHA4. Pixel electrode PER2 has a projection PJ4 disposed to be apart from contact hole CHA5 and extending toward contact hole CHA5.

In the present embodiment, the positions of contact holes CHA1 and CHA4 are changed as above, and accordingly, contact holes CHA2, CHA3, and CHA4 of pixel PX1 and contact holes CHA2 and CHA4 of pixel PX2 are arranged linearly along with the second direction D2. Other pixels have the same structure. Therefore, between two adjacent gate lines G, contact holes CHA of subpixels are arranged in a substantially linear manner along with the second direction D2 in the proximity of one gate line G.

Note that, the arrangement manner of contact holes CHA2, CHA3, and CHA4 of pixel PX1 and of contact holes CHA2 and CHA4 of pixel PX2 is not necessarily an absolute straight line but should be substantially linear. A substantially linear manner includes a case where, for example, contact holes arranged in a direction (the second direction D2 in FIG. 18) are shifted from each other with respect to their centers of balance but overlap each other. That is, contact holes CHA2, CHA3, and CHA4 of pixel PX1 and contact holes CHA2 and CHA4 of pixel PX2 may be slightly shifted in the first direction D1. Connection holes do not help the image display, and thus, they should be override with light-shielding layers BM and overlapping parts of color filters, and with the arrangement of contact holes of the present embodiment, an area to be covered can be reduced.

In the example of FIG. 18, connection electrodes CAL are arranged along the second direction D2 in areas A1 and A3. Therefore, the shape of source lines S1 to S6 is improved such that two connection electrodes CAL can be arranged side by side.

That is, source lines S1 and S4 have a first part which extends linearly along the first direction D1 in the proximity of crossing points with gate line G2 and a second part which extends linearly along the first direction D1 in the proximity of crossing points with gate lines G1 and G3 wherein the first part is longer than the second part. In contrast, two source lines S2 and S3 extending side by side and two source lines S5 and S6 extending side by side have a first part which extends linearly along the first direction D1 in the proximity of crossing points with gate line G2 and a second part which extends linearly along the first direction D1 in the proximity of crossing points with gate lines G1 and G3 wherein the first part is longer than the second part.

With source lines S1 to S6 formed as above, a gap between adjacent source lines S with two connection electrodes CAL arranged along the second direction D2 interposed therebetween becomes greater in the proximity of gate lines G1 to G3. Therefore, a sufficient space which can contain two connection electrodes CAL arranged side by side can be secured. Here, a specific example of a gap between source lines S will be explained with reference to gate line G2 and source lines S3 to S5. In plan view, a distance between a crossing point of gate line G2 and source line S3 and a crossing point of gate line G2 and source line S4 is given a first distance. In plan view, a distance between a crossing point of gate line G2 and source line S4 and a crossing point of gate line G2 and source line S5 is given a second distance. In the example of FIG. 18, the second distance is greater than the first distance.

With source lines S1 to S6 formed as above, extending parts (parts corresponding to comb tooth in a comb electrode) of pixel electrodes which extend from the proximity of the end of a source line to the proximity of the end of another source line can have different lengths as with pixel electrodes PEB and PEW in areas A2 and A4. Thereby, pixel electrodes which are suitably fit to the shape of source lines can be formed.

FIG. 19 is a plan view which schematically shows an example of color filters CFG1, CFG2, CFR1, CFR2, CFB, and CFW disposed in pixels PX1 and PX2 shown in FIG. 18. In the example depicted, edges of color filters CFG1, CFG2, CFR1, CFR2, CFB, and CFW of pixel PX1 in the second direction D2 and edges of color filters CFG1, CFG2, CFR1, and CFR2 of pixel PX2 in the second direction D2 are shaped to go along source lines S1 to S6.

FIG. 20 shows color filters CFG1, CFG2, CFR1, CFR2, CFB, and CFW and contact holes CHA1 to CHA6 in FIG. 19. As in the example of FIG. 17, color filters CFG1, CFG2, CFR1, CFR2, CFB, and CFW in FIG. 20 do not have a recess HG1, HG2, HR1, HR2, HB, or HW and thus are easily processed for their simpler shapes.

In that case, within area A1, a color filter CF at the gate line G2 side where contact holes are gathered (that is, color filter CFR1 in FIG. 19) can be formed smaller than a color filter CF at the gate line G1 side (that is, color filter CFG1 in FIG. 19). Within area A3, a color filter CF at the gate line G3 side can be formed smaller. Here, in consideration of the color brightness and the sensitivity of the human eye, green color filters should be formed larger and red color filters should be formed smaller.

In the color filter layer CFL of pixel PX1, a space SP1 is formed extending linearly along the second direction between color filters CFR1 and CFB and color filters CFG2 and CFW, and contact holes CHA2, CHA3, and CHA4 are arranged in space SP1. Space SP1 continues to pixel PX2 and subsequent pixels PX.

Note that, in the color filter CFG1 side, a space SP2 is formed between pixels PX1 and PX2 and pixels adjacent thereto in the first direction D1, and contact holes CHA1 of pixels PX1 and PX2 are arranged in this space. In space SP2, contact holes of the adjacent pixels (for example, contact holes CHA5 and CHA6) are arranged.

Furthermore, in the color filter CFR2 side, a space SP3 is formed between pixels PX1 and PX2 and pixels adjacent thereto in the first direction D1, and contact holes CHA5 and CHA6 of pixels PX1 and PX2 are arranged in this space. In space SP2, contact holes of the adjacent pixels (for example, contact holes CHA1) are arranged.

FIG. 21 shows a positional relationship between a light-shielding layer BM and elements such as gate lines G (G1 to G3), source lines (S1 to S6), contact holes CHA1 to CHA6, and the connection electrodes CAL. As shown, contact holes CHA1 to CHA6 and connection electrodes CAL are arranged linearly, and thus, the light-shielding layer BM overlapping each of gate lines G1 to G3 can be made narrower in the first direction D1. Therefore, the aperture ratio can be improved. Here, if a spacer SOA is formed to overlap adjacent contact holes in the arrangement direction of the contact holes (for example, the second direction D2 in FIG. 21) in plan view, the light-shielding layer BM can be formed much smaller.

If a spacer SOA is provided, the light-shielding layer BM must be formed large and the area of each pixel is thus decreased. With the arrangement of the contact holes of the present embodiment is adopted, the light-shielding layer BM is not formed excessively large.

Furthermore, with contact holes CHA1 to CHA6 arranged linearly, color filters CFG1, CFG2, CFR1, CFR2, CFB, and CFW can be formed in a simpler shape, and these color filters can be arranged to be closer to contact holes CHA1 to CHA6. Therefore, the third insulating layer IL3 can be made thicker in the proximity of contact holes CHA1 to CHA6 and parasitic capacitance between the common electrode CE and connection electrodes CAL can be reduced.

Fourth Embodiment

Now, the fourth embodiment will be described. The structures and effects already described in the sections related to the first to third embodiments will be omitted.

In the first to third embodiments, pixel electrodes PE are disposed closer to the liquid crystal layer LQ side as compared to the common electrode CE as shown in FIGS. 6 and 7. In that case, contact holes CHA1 to CHA6 must be pierced through the fourth insulating layer IL4 and the common electrode CE. Consequently, contact holes CHA1 to CHA6 are structurally complicated and contact holes CHA1 to CHA6 have a large area.

Figure 22:
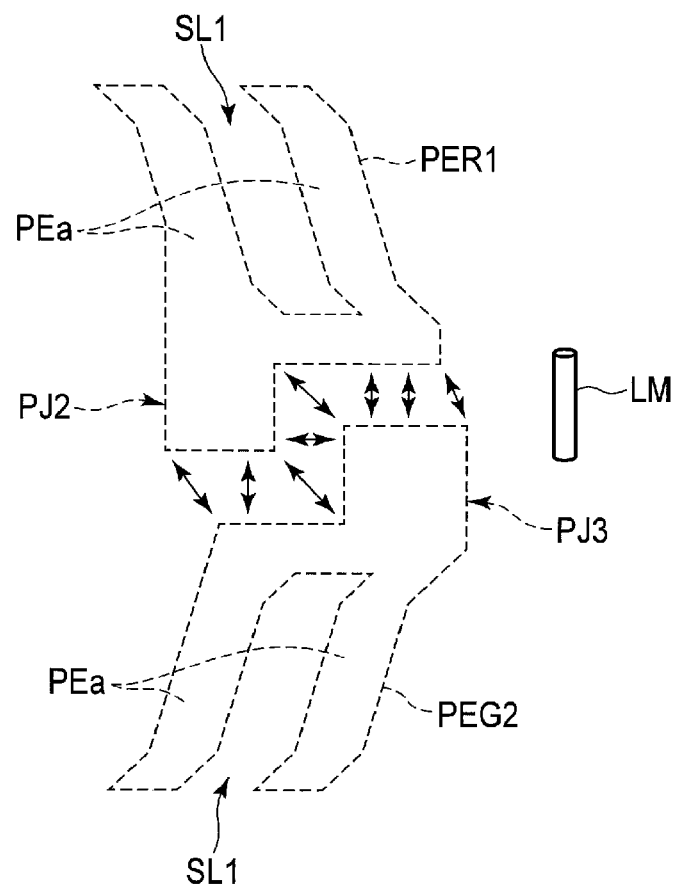
FIG. 22 shows a mechanism of alignment disturbance in a liquid crystal layer.

Furthermore, if pixel electrodes PEG1, PEG2, PER1, and PER2 have projections PJ1 to PJ4 as in the third embodiment, the alignment of liquid crystal layer LQ is disturbed. FIG. 22 shows the alignment disturbance and shows pixel electrode PER1 having a projection PJ2 and pixel electrode PEG2 having a projection PJ3. Because of projections PJ2 and PJ3, the intermediate shape between pixel electrodes PER1 and PEG2 becomes complicated. If pixel electrodes PER1 and PEG2 have different potentials, an electric field is produced therebetween. In FIG. 22, directions of electric flux lines are depicted in solid line arrows and a liquid crystal molecule LM in the liquid crystal layer LQ is depicted schematically. The liquid crystal molecule LM is, for example, originally aligned in a longitudinal direction.

Some of the electric flux lines between pixel electrodes PER1 and PEG2 are not parallel to the original alignment direction of the liquid crystal molecule LM, and thus, alignment disturbance may occur in the proximity of the border of pixel electrodes PER1 and PEG2. Especially, if a difference between the potentials of pixel electrodes PER1 and PEG2 becomes greater, the alignment disturbance becomes greater. The proximity of the border of pixel electrodes PER1 and PEG2 is covered with a light-shielding layer BM; however, strong alignment disturbance may affect an area which is not opposed to the light-shielding layer BM. In such a case, image display is disturbed and a flash afterglow may be recognized.

In the present embodiment, a structure to solve the above problems will be introduced. FIG. 23 is a plan view which shows an example of a structure applicable to pixels PX1 and PX2 of a liquid crystal display device DSP of the present embodiment. In the example depicted, subpixels PXG1, PXG2, PXR1, PXR2, PXB, and PXW of pixel PX1 and subpixels PXG1, PXG2, PXR1, and PXR2 of pixel PX2 are shown as in FIG. 18. Hereinafter, points different from the structure shown in FIG. 18 will be explained mainly.

The example of FIG. 23 shows a common top type liquid crystal display device in which the common electrode CE is disposed closer to a liquid crystal layer as compared to pixel electrodes PEG. In the present embodiment, unlike the example of FIG. 18, pixel electrode PEG1, PEG2, PER1, PER2, PEB, and PEW do not have a slit SL1. On the other hand, the common electrode CE has two slits SL2 in each of areas A1 to A4. Note that the common electrode CE may have a single slit SL2 in each area or may have three or more slits SL2 in each area. Slits SL2 extend to be inclined with respect to the first direction D1 and the second direction D2 as a whole.

The common electrode CE overlaps, for example, gate lines G1 to G3, source lines S1 to S6, semiconductor layers SC, connection electrodes CAL, contact holes CHA1 to CHA6, contact holes CHB1 to CHB6, and projections PJ1 to PJ4.

Slits SL2 in area A1 overlap pixel electrodes PEG1 and PER1, slits SL2 in area A2 overlap pixel electrode PEB, slits SL2 in area A3 overlap pixel electrodes PEG2 and PER2, and slits SL2 in area A4 overlap pixel electrode PEW.

Figure 24:
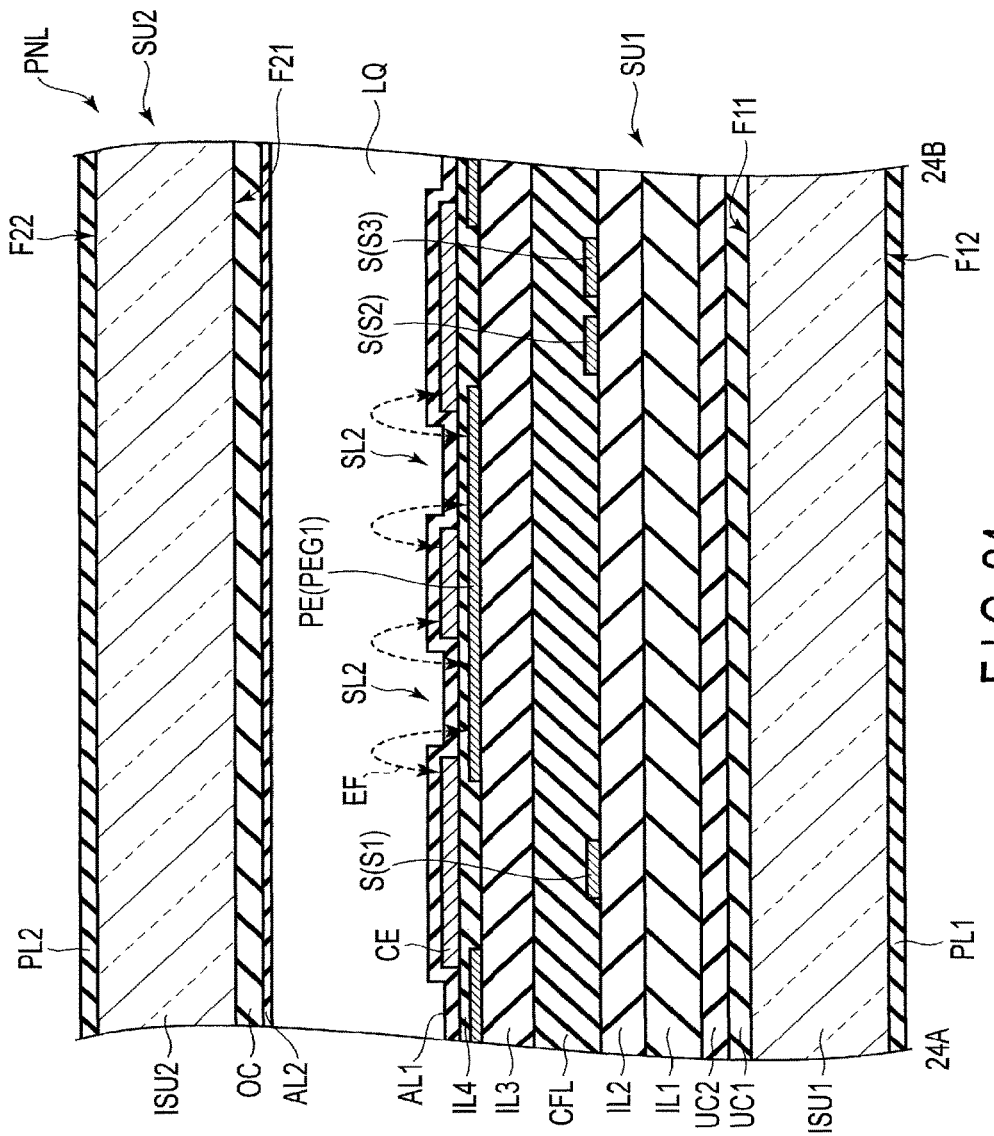
FIG. 24 is a cross-sectional view which schematically shows the display panel taken along line 24A-24B of FIG. 23.

FIG. 24 is a schematic cross-sectional view of a display panel PNL taken along line 24A-24B of FIG. 23. In the present embodiment, a pixel electrode PE (PEG1) is formed on the surface of the third insulating layer IL3 at the liquid crystal layer LQ side, the pixel electrode PE and third insulating layer IL3 are partly covered with a fourth insulating layer IL4, a common electrode CE is formed on the surface of the fourth insulating layer IL4 at the liquid crystal layer LQ side, and the common electrode CE and fourth insulating layer IL4 are partly covered with a first alignment film AL1. In such a structure, if a voltage is applied between the pixel electrode PE and common electrode CE, a fringe field EF containing components parallel to the main surface of the substrate is produced. By the fringe field EF, liquid crystal molecules of the liquid crystal layer LQ rotate in a plane parallel to the main surface of the substrate.

FIG. 24 shows the structure of the display panel PNL in cross-sectional view focusing on subpixel PXG1; however, the same structure and effect are applicable to other subpixels PXG2, PXR1, PXR2, PXB, and PXW with pixel electrodes PEG2, PER1, PER2, PEB, and PEW.

Figure 25:
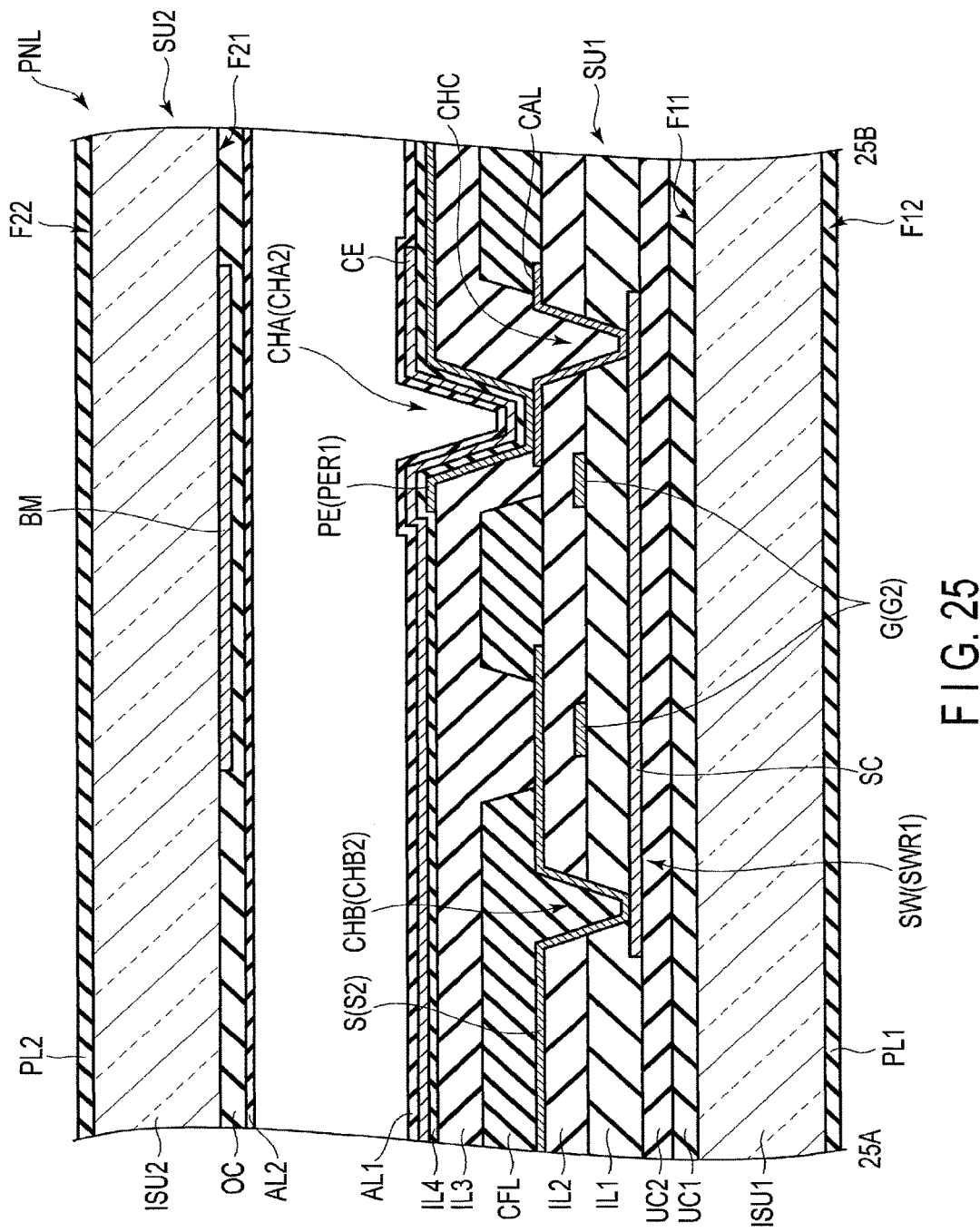
FIG. 25 is a cross-sectional view which schematically shows the display panel taken along line 25A-25B of FIG. 23.

FIG. 25 is a cross-sectional view which schematically shows the display panel PNL taken along line 25A-25B in FIG. 23. In the present embodiment, the pixel electrode PE (PER1) is disposed closer to the connection electrode CAL side as compared to the fourth insulating layer IL4 and the common electrode CE, and a contact hole CHA2 is not pierced through the fourth insulating layer IL4 and the common electrode CE.

FIG. 25 shows the structure of the display panel PNL in cross-sectional view focusing on subpixel PXR1; however, the same structure and effect are applicable to other subpixels PXG1, PXG2, PXR2, PXB, and PXW with pixel electrodes PEG1, PEG2, PEB, and PEW, switching elements SWG1, SWG2, SWR2, SWB, and SWW, contact holes CHA1, CHA5 to CHA6, contact holes CHB1, CHB3 to CHB6.

In the present embodiment, the number of layers interposed between pixel electrodes PEG1, PEG2, PER1, PER2, PEB, and PEW and connection electrodes CAL of subpixels PXG1, PXG2, PXR1, PXR2, PXB, and PXW can be reduced, and thus, contact holes CHA1 to CHA6 are formed structurally simple and reduced in size. Thus, the aperture ratio of pixels PX can be improved.

Furthermore, pixel electrodes arranged along the first direction D1 with a gate line G interposed therebetween have an intermediate space which overlaps the common electrode CE as in pixel electrodes PER1 and PEG2. Thus, a field produced in the intermediate space between pixel electrodes can be blocked by the common electrode CE. Therefore, the alignment disturbance explained with respect to FIG. 22 can be reduced.

(Variations)

Various variations can be applied to the structures of the above embodiments.

For example, in each embodiment, contact holes CHA1 to CHA6 each have a through-hole formed in the third insulating layer IL3. However, two or more contact holes CHA1 to CHA6 may share a single through-hole formed in the third insulating layer IL3.

Figure 26:
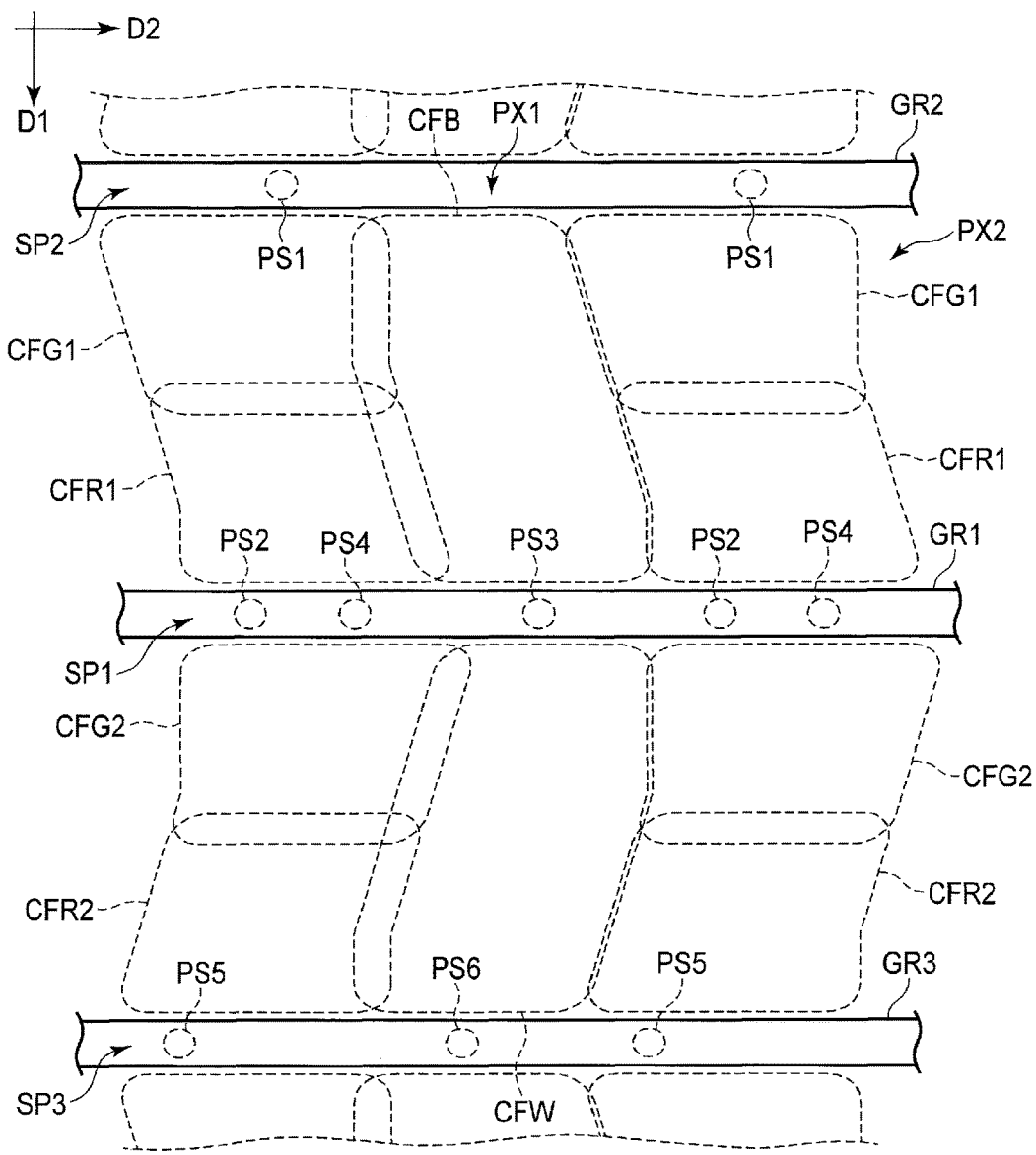
FIG. 26 shows a variation of the third embodiment.

FIG. 26 shows a case where the above variation is applied to the structure of the third embodiment, and shows color filters CFG1, CFG2, CFR1, CFR2, CFB, and CFW in plan view. Color filters CFG1, CFG2, CFR1, CFR2, CFB, and CFW are arranged with the same positional relationship as in FIG. 20.

In the example of FIG. 26, the third insulating layer IL3 has a groove GR1 overlapping space SP1, groove GR2 overlapping space SP2, and groove GR3 overlapping space SP3. Grooves GR1 to GR3 are through-holes extending linearly along the second direction D2.

FIG. 26 shows a position PS1 at which pixel electrode PEG1 of subpixel PXG1 and the connection electrode CAL contact, position PS2 at which pixel electrode PER1 of subpixel PXR1 and the connection electrode CAL contact, position PS3 at which pixel electrode PEB of subpixel PXB and the connection electrode CAL contact, position PS4 at which pixel electrode PEG2 of subpixel PXG2 and the connection electrode CAL contact, position PS5 at which pixel electrode PER2 of subpixel PXR2 and the connection electrode CAL contact, and position PS6 at which pixel electrode PEW of subpixel PXW and the connection electrode CAL contact. Positions PS1 to PS6 are depicted as dotted line circles.

Position PS1 is in groove GR2, positions PS2, PS3, and PS4 are in groove GR1, and positions PS5 and PS6 are in groove GR3. Positions PS1 to PS6 are, for example, disposed to correspond to through-holes provided with the fourth insulating layer IL4 for the connection of pixel electrodes PEG1, PEG2, PER1, PER2, PEB, and PEW and connection electrodes CAL of subpixels PXG1, PXG2, PXR1, PXR2, PXB, and PXW.

As above, pixel electrodes PEG1, PEG2, PER1, PER2, PEB, and PEW are electrically connected to connection electrodes CAL of subpixels PXG1, PXG2, PXR1, PXR2, PXB, and PXW via through-holes GR1 to GR3. That is, in the example of FIG. 26, groove GR2 functions as a first aperture formed in the third insulating layer IL3 as a part of contact hole CHA1, groove GR1 functions as second, third, and fourth apertures formed in the third insulating layer IL3 as a part of contact holes CHA2, CHA3, and CHA4, groove GR3 functions as fifth and sixth apertures formed in the third insulating layer IL3 as a part of contact holes CHA5 and CHA6.

From a different viewpoint, in the example of FIG. 26, first apertures of pixels PX1 and PX2 arranged along the second direction D2 communicate with each other, second, third, and fourth apertures of pixels PX1 and PX2 communicate with each other, and fifth and sixth apertures of pixels PX1 and PX2 communicate with each other.

With such a structure, the third insulating layer IL3 can be easily processed as compared to a case where apertures corresponding to contact holes CHA1 to CHA6 are separately provided with the third insulating layer IL3. Furthermore, each of grooves GR1 to GR3 having a linear opening can be formed stably.

Note that, the grooves in the third insulating layer IL3 may be formed to simply cover the apertures in the third insulating layer IL3 corresponding to several contact holes CHA in a close range such as contact holes CHA2 and CHA4 for their communication.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A color filter substrate comprising:
an insulating substrate;
a first signal line, a second signal line, and a seventh signal line extended along a row direction, to which a first signal is supplied;
a third signal line, a fourth signal line, a fifth signal line, and a sixth signal line extended along a column direction crossing the row direction, to which a second signal which is different from the first signal is supplied, the third, fourth, fifth, and sixth signal lines crossing the first, second, and seventh signal lines;
a first switching element, a second switching element, a third switching element, and a fourth switching element;
a second conductive film and a fourth conductive film;
a first pixel electrode formed in a first area defined by the first signal line, the second signal line, the third signal line, and the fourth signal line in a plan view, and the first pixel electrode formed at the first signal line side;
a second pixel electrode formed in the first area at the second signal line side;
a third pixel electrode formed in a second area defined by the first signal line, the second signal line, the fifth signal line, and the sixth signal line in a plan view;
a fourth pixel electrode formed in a third area defined by the second signal line, the seventh signal line, the third signal line, and the fourth signal line in a plan view, and the fourth pixel electrode formed at the second signal line side;
a color filter layer including an opening portion and color filters disposed between the first, second, third and fourth pixel electrodes and the insulating substrate; and
an insulating layer covering the color filter layer, wherein the second area is arranged in a same row as the first area in the row direction,
the third area is arranged in a same column as the first area in the column direction,
the third pixel electrode is arranged in a same row as the first pixel electrode and the second pixel electrode with the fourth and fifth signal lines interposed between the third pixel electrode and the first and second pixel electrodes,
the insulating layer has a first aperture portion, a second aperture portion, a third aperture portion, and a fourth aperture portion pierced through the insulating layer,
the first pixel electrode is electrically connected to the first switching element through the first aperture portion, the second pixel electrode is electrically connected to the second switching element through the second aperture portion via the second conductive film, the third pixel electrode is electrically connected to the third switching element through the third aperture portion, and the fourth pixel electrode is electrically connected to the fourth switching element through the fourth aperture portion via the fourth conductive film,
the first aperture portion is formed at the first signal line side, and the second aperture portion is formed at the second signal line side,
the second aperture portion and the fourth aperture portion pass through the same opening portion of the color filter layer, and
the second conductive film and the fourth conductive film pass through the same opening portion of the color filter layer.
2. The color filter substrate of claim 1, wherein the color filters in the color filter layer do not overlap the first aperture portion, the second aperture portion, and the third aperture portion in a plan view.

3. The color filter substrate of claim 1, wherein the color filter layer includes a first color filter of a first color opposed to the first pixel electrode, a second color filter of a second color opposed to the second pixel electrode, and a third color filter of a third color opposed to the third pixel electrode,
   each of the first color filter, the second color filter, and the third color filter has a recess in a circumference thereof in a plan view, and
   the first aperture portion is disposed in the recess of the first color filter, the second aperture portion is disposed in the recess of the second color filter, and the third aperture portion is disposed in the recess of the third color filter.

4. The color filter substrate of claim 1, wherein the first aperture portion and the second aperture portion are formed in the first area.

5. The color filter substrate of claim 1, wherein the second aperture portion, the third aperture portion, and the fourth aperture portion are arranged in a substantially linear manner.

6. The color filter substrate of claim 1, wherein the third aperture portion is formed in the second area,
   a distance between a crossing point of the second signal line and the third signal line and a crossing point of the second signal line and the fourth signal line in a plan view is a first distance, and a distance between a crossing point of the second signal line and the fifth signal line and a crossing point of the second signal line and the sixth signal line in plan view is a second distance, and
   the first distance is greater than the second distance.

7. The color filter substrate of claim 1, wherein the second aperture portion and the fourth aperture portion communicate with each other.

8. The color filter substrate of claim 1, wherein the third aperture portion is formed at the second signal line side.

9. The color filter substrate of claim 1, wherein the color filter layer includes a first color filter of a first color opposed to the first pixel electrode, and a second color filter of a second color opposed to the second pixel electrode,
   the first color is green, and the second color is red, and
   the first color filter is greater in size than the second color filter.

10. The color filter substrate of claim 1, further comprising:
   a second insulating layer covering the first pixel electrode, the second pixel electrode, and the third pixel electrode, and
   a common electrode opposed to the first pixel electrode, the second pixel electrode, and the third pixel electrode with the second insulating layer interposed therebetween.

11. The color filter substrate of claim 1, wherein the opening of the color filter has a groove shape.

12. The display device according to claim 1, wherein the first pixel electrode, the second pixel electrode, the third pixel electrode, and the fourth pixel electrode are formed on the insulating substrate.

13. A display device comprising a first substrate and a second substrate opposed to the first substrate, wherein
   the first substrate comprises:
   an insulating substrate;
   a first signal line, a second signal line, and a seventh signal line extended along a row direction, to which a first signal is supplied;
   a third signal line, a fourth signal line, a fifth signal line, and a sixth signal line extended along a column direction crossing the row direction, to which a second signal which is different from the first signal is supplied, the third, fourth, fifth, and sixth signal lines crossing the first, second, and seventh signal lines;
   a first switching element, a second switching element, a third switching element, and a fourth switching element;
   a second conductive film and a fourth conductive film;
   a first pixel electrode formed in a first area defined by the first signal line, the second signal line, the third signal line, and the fourth signal line in a plan view, and the first pixel electrode formed at the first signal line side;
   a second pixel electrode formed in the first area at the second signal line side;
   a third pixel electrode formed in a second area defined by the first signal line, the second signal line, the fifth signal line, and the sixth signal line in a plan view;
   a fourth pixel electrode formed in a third area defined by the second signal line, the seventh signal line, the third signal line, and the fourth signal line in a plan view, and the fourth pixel electrode formed at the second signal line side;
   a color filter layer including an opening portion and color filters disposed between the first, second, third and fourth pixel electrodes and the insulating substrate; and
   an insulating layer covering the color filter layer, wherein
   the second area is arranged in a same row as the first area in the row direction,
   the third area is arranged in a same column as the first area in the column direction,
   the third pixel electrode is arranged in a same row as the first pixel electrode and the second pixel electrode with the fourth and fifth signal lines interposed between the third pixel electrode and the first and second pixel electrodes,
   the insulating layer has a first aperture portion, a second aperture portion, a third aperture portion, and a fourth aperture portion pierced through the insulating layer,
   the first pixel electrode is electrically connected to the first switching element through the first aperture portion, the second pixel electrode is electrically connected to the second switching element through the second aperture portion via the second conductive film, the third pixel electrode is electrically connected to the third switching element through the third aperture portion, and the fourth pixel electrode is electrically connected to the fourth switching element through the fourth aperture portion via the fourth conductive film,
   the first aperture portion is formed at the first signal line side, and the second aperture portion is formed at the second signal line side;
   the second aperture portion and the fourth aperture portion pass through the same opening portion of the color filter layer, and
   the second conductive film and the fourth conductive film pass through the same opening portion of the color filter layer.

14. The display device of claim 13, wherein the color filters in the color filter layer do not overlap the first aperture portion, the second aperture portion, and the third aperture portion in a plan view.

15. The display device of claim 13, further comprising:
   a spacer disposed between the first substrate and the second substrate to overlap the second signal line; and
   a light-shielding layer overlapping the spacer, the second aperture portion, the third aperture portion, and the fourth aperture portion.

16. The display device of claim 13, wherein the first aperture portion and the second aperture portion are formed in the first area.

17. The display device of claim 13, wherein the second aperture portion, the third aperture portion, and the fourth aperture portion are arranged in a substantially linear manner.

18. The display device of claim 13, wherein the second aperture portion and the fourth aperture portion communicate with each other.

19. The display device of claim 13, wherein the third aperture portion is formed at the second signal line side.

20. The display device of claim 13, wherein the opening of the color filter layer has a groove shape.

* * * * *